United States Patent
Kataishi et al.

(10) Patent No.: US 10,069,097 B2
(45) Date of Patent: Sep. 4, 2018

(54) LIGHT-EMITTING ELEMENT, LIGHT-EMITTING DEVICE, LIGHTING DEVICE, AND ELECTRONIC APPLIANCE

(71) Applicant: Semiconductor Energy Laboratory Co., Ltd., Kanagawa-ken (JP)

(72) Inventors: Riho Kataishi, Kanagawa (JP); Toshiki Sasaki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/698,140

(22) Filed: Apr. 28, 2015

(65) Prior Publication Data
US 2015/0318335 A1 Nov. 5, 2015

(30) Foreign Application Priority Data

Apr. 30, 2014 (JP) ................. 2014-093657

(51) Int. Cl.
*H01L 27/32* (2006.01)
*H01L 51/00* (2006.01)
(Continued)

(52) U.S. Cl.
CPC ........ *H01L 51/5092* (2013.01); *H01L 27/322* (2013.01); *H01L 27/323* (2013.01);
(Continued)

(58) Field of Classification Search
CPC ................................................. H01L 51/5092
See application file for complete search history.

(56) References Cited

U.S. PATENT DOCUMENTS 6,737,800 B1 * 5/2004 Winters ................ C09K 11/06
313/113
7,387,904 B2 6/2008 Saito et al.
(Continued)

FOREIGN PATENT DOCUMENTS

| JP | 2003-272867 A | 9/2003 |
|----|---------------|--------|
| JP | 2011-096406 A | 5/2011 |
| WO | WO 2015/118426 A2 | 8/2015 |

OTHER PUBLICATIONS

Christian B. Nielsen, Sarah Holliday, Hung-Yang Chen, Samuel J. Cryer, and Iain McCulloch; "Non-Fullerene Electron Acceptors for Use in Organic Solar Cells"; Accounts of Chemical Research 2015 48 (11), 2803-2812; DOI: 10.1021/acs.accounts.5b00199.*
(Continued)

*Primary Examiner* — Su C Kim
*Assistant Examiner* — David S Wilbert
(74) *Attorney, Agent, or Firm* — Husch Blackwell LLP

(57) ABSTRACT

An inverted-structure light-emitting element is provided. One embodiment of the invention disclosed in this specification is a light-emitting element including a cathode, a layer serving as a buffer over the cathode, an electron-injection layer over the layer serving as a buffer, a light-emitting layer over the electron-injection layer, and an anode over the light-emitting layer. The electron-injection layer includes an alkali metal or an alkaline earth metal. The layer serving as a buffer includes an electron-transport material. In the inverted-structure light-emitting element, contact of the alkali metal or alkaline earth metal included in a material of the electron-injection layer with the already formed cathode increases the driving voltage of an EL element and reduces emission efficiency. This problem becomes prominent particularly when the cathode includes an oxide conductive
(Continued)

film. To prevent this, the layer serving as a buffer is provided between the cathode and the electron-injection layer.

33 Claims, 18 Drawing Sheets

(51) Int. Cl.
*H01L 51/50* (2006.01)
*H01L 51/52* (2006.01)
*H01L 29/786* (2006.01)
*H01L 29/24* (2006.01)

(52) U.S. Cl.
CPC .......... *H01L 27/3248* (2013.01); *H01L 29/24* (2013.01); *H01L 29/786* (2013.01); *H01L 29/7869* (2013.01); *H01L 51/0067* (2013.01); *H01L 51/0071* (2013.01); *H01L 51/5072* (2013.01); *H01L 51/5206* (2013.01); *H01L 51/5234* (2013.01); *H01L 51/0052* (2013.01); *H01L 51/0059* (2013.01); *H01L 51/0072* (2013.01); *H01L 51/0074* (2013.01); *H01L 51/0085* (2013.01); *H01L 2251/301* (2013.01); *H01L 2251/306* (2013.01); *H01L 2251/308* (2013.01); *H01L 2251/5353* (2013.01)

(56) References Cited

U.S. PATENT DOCUMENTS

| | | |
|---|---|---|
| 7,598,670 B2 | 10/2009 | Kumaki et al. |
| 7,956,349 B2 | 6/2011 | Tsutsui et al. |
| 7,985,974 B2 | 7/2011 | Nowatari et al. |
| 8,158,991 B2 | 4/2012 | Nowatari et al. |
| 2002/0130828 A1* | 9/2002 | Yamazaki ............ G09G 3/3258 345/80 |
| 2006/0263629 A1 | 11/2006 | Aziz et al. |
| 2006/0289882 A1* | 12/2006 | Nishimura ............ C09K 11/06 257/94 |
| 2008/0286445 A1* | 11/2008 | Suzuki ................ H01L 51/0052 427/64 |
| 2010/0133525 A1* | 6/2010 | Arai .................... H01L 29/7869 257/40 |
| 2010/0134735 A1* | 6/2010 | Nakamura .......... H01L 31/1055 349/116 |
| 2011/0215307 A1 | 9/2011 | Nowatari et al. |
| 2012/0205686 A1 | 8/2012 | Seo et al. |
| 2012/0228588 A1 | 9/2012 | Mitsuya |
| 2012/0235166 A1 | 9/2012 | Nowatari et al. |
| 2012/0256197 A1* | 10/2012 | Matsuhisa .......... H01L 51/5092 257/79 |
| 2015/0318335 A1* | 11/2015 | Kataishi .............. H01L 27/3248 257/40 |

OTHER PUBLICATIONS

Fukagawa, H. et al., "Highly Efficient Inverted OLED with Air-Stable Electron Injection Layer," SID Digest '13: SID International Symposium Digest of Technical Papers, May 21, 2013, pp. 1466-1469.

\* cited by examiner

FIG. 4A
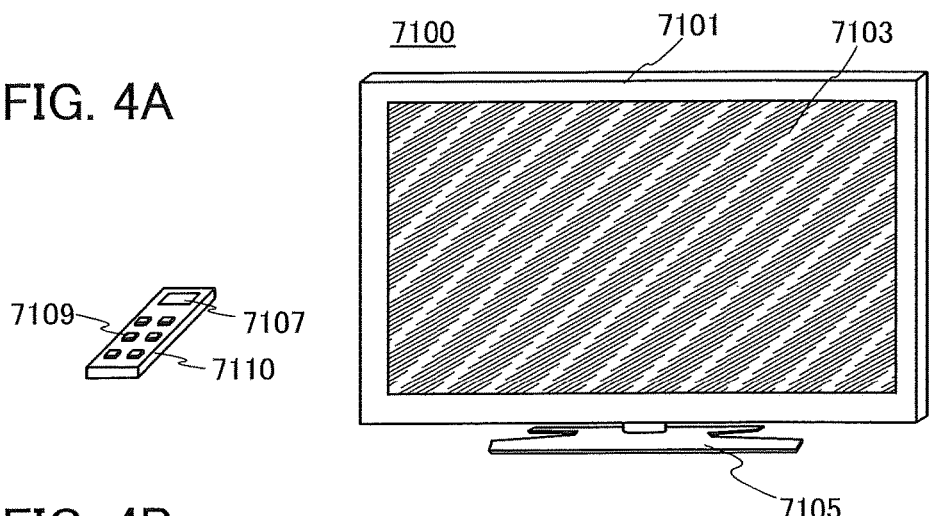
FIG. 4B
FIG. 4C
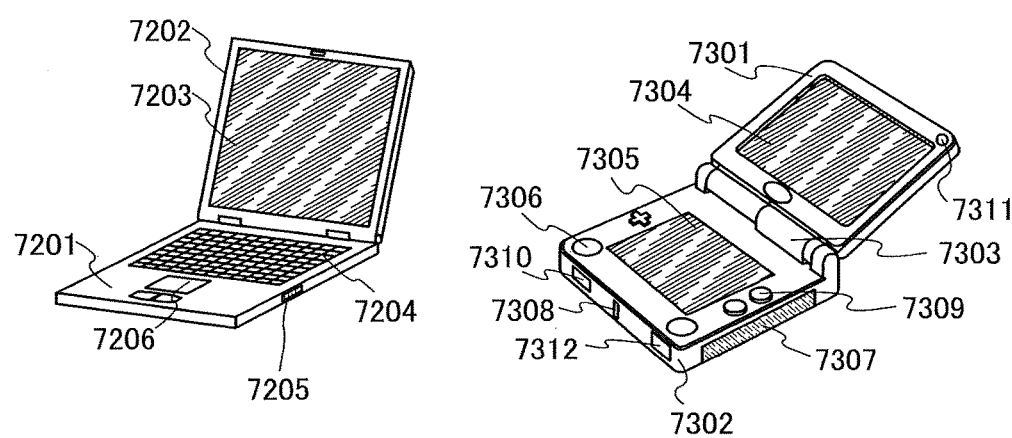
FIG. 4D
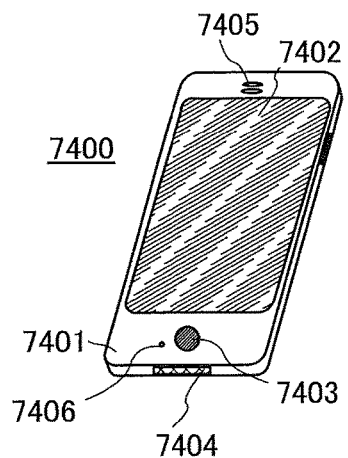

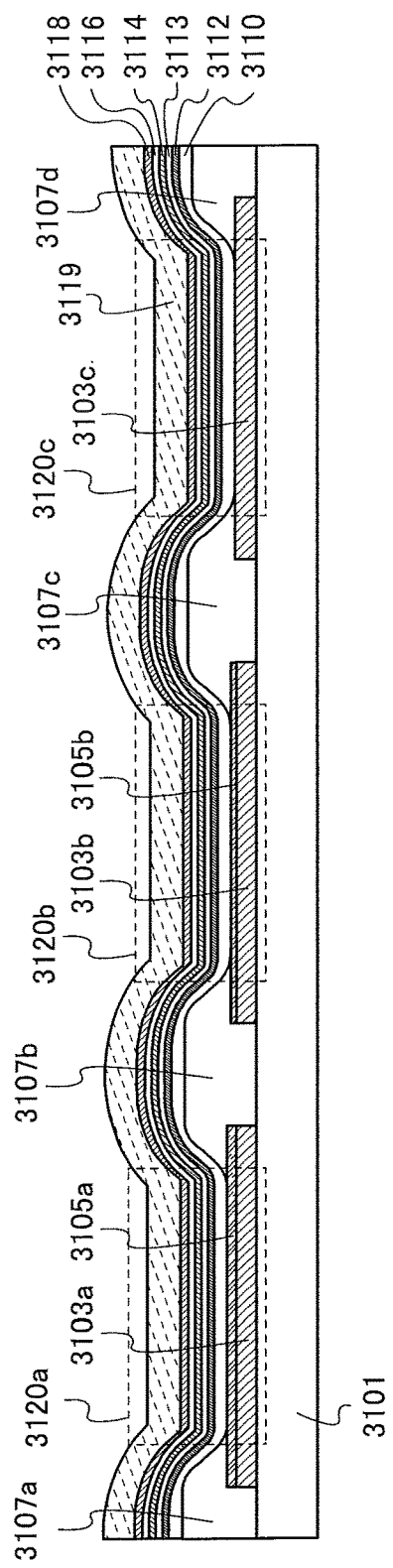

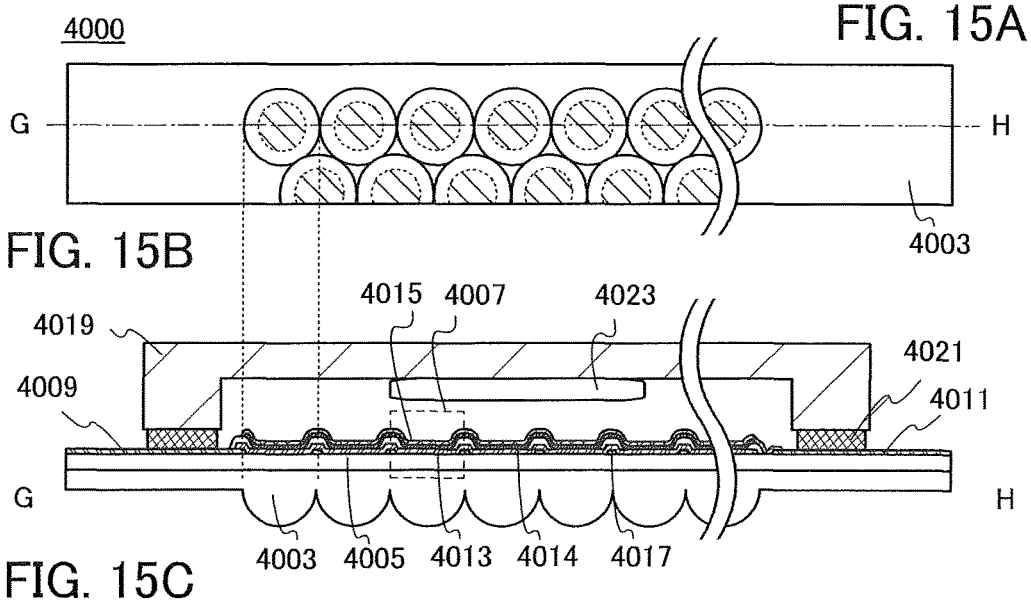

LIGHT-EMITTING ELEMENT, LIGHT-EMITTING DEVICE, LIGHTING DEVICE, AND ELECTRONIC APPLIANCE

BACKGROUND OF THE INVENTION

1. Field of the Invention

One embodiment of the present invention relates to a light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

Light-emitting elements utilizing electroluminescence have been currently under active research and development. In a basic structure of the light-emitting element utilizing electroluminescence, a layer containing a light-emitting substance (hereinafter, the layer is referred to as a "light-emitting layer") is interposed between a pair of electrodes. By voltage application between the pair of electrodes of the light-emitting element, light can be emitted from the light-emitting substance.

In the manufacturing process of a light-emitting element, an electrode serving as an anode of the light-emitting element is formed over a substrate before the other electrode serving as a cathode is formed as described above in some cases, and in other cases, an electrode serving as a cathode is formed over a substrate before the other electrode serving as an anode is formed. An element structure formed in the former cases of the manufacturing process is referred to as an "ordered structure", and an element structure formed in the latter cases is referred to as an "inverted structure". Not only these element structures of the light-emitting element are mutually inverted over a substrate, but also the element structures may differ from each other depending on the difference in manufacturing processes (e.g., Patent Document 1).

Furthermore, a structure in which an oxide semiconductor (OS) is used for a semiconductor layer of a field effect transistor (FET) for controlling a light-emitting element has also been proposed. In particular, since an OS-FET using indium gallium zinc oxide (IGZO) as an oxide semiconductor is an n-type transistor in which the majority carriers are electrons, a combination of the OS-FET and the inverted-structure light-emitting element whose electrode connected to the OS-FET serves as a cathode has been proposed as the way to improve element characteristics (e.g., Non-Patent Document 1).

REFERENCES

Patent Documents

[Patent Document 1] Japanese Published Patent Application No. 2003-272867

Non-Patent Document

[Non-Patent Document] H. Fukagawa, K. Mori, Y. Arimoto and M. Nakajima, SID 2013 DIGEST, p. 1469, 2013

SUMMARY OF THE INVENTION

As described above, the inverted-structure light-emitting element can be easily combined with the OS-FET and can be therefore expected to have better element characteristics than a conventional one. However, in the inverted-structure light-emitting element where an electron-injection layer, an electron-transport layer, and a light-emitting layer each including an alkali metal or an alkaline earth metal are stacked in this order over the cathode, contact of the electron-injection layer including an alkali metal or an alkaline earth metal with the already formed cathode, in particular, with a cathode including an oxide semiconductor transparent conductive film, increases the driving voltage of an EL element and shortens the lifetime of the element.

In view of the above problem, an object of one embodiment of the present invention is to provide a novel light-emitting element. Another object of one embodiment of the present invention is to provide a novel structure of a light-emitting element. Another object of one embodiment of the present invention is to provide a novel inverted-structure light-emitting element.

Note that the description of these objects does not disturb the existence of other objects. In one embodiment of the present invention, there is no need to achieve all the objects. Other objects are apparent from and can be derived from the description of the specification, the drawings, the claims, and the like.

One embodiment of the invention disclosed in this specification is a light-emitting element including an anode, a cathode, a light-emitting layer between the anode and the cathode, a first layer between the cathode and the light-emitting layer, and a second layer between the first layer and the light-emitting layer. The second layer includes an alkali metal or an alkaline earth metal. The first layer includes an electron-transport material.

Another embodiment of the invention disclosed in this specification is a light-emitting element including a cathode, a first layer over the cathode, a second layer over the first layer, a light-emitting layer over the second layer, and an anode over the light-emitting layer. The second layer includes an alkali metal or an alkaline earth metal. The first layer includes an electron-transport material.

Another embodiment of the invention disclosed in this specification is a light-emitting element including an anode, a cathode, a light-emitting layer between the anode and the cathode, a first layer between the cathode and the light-emitting layer, a second layer between the first layer and the light-emitting layer, and a third layer. The third layer is between the cathode and the first layer. The third layer contains a hole-transport material and an electron acceptor. The second layer includes an alkali metal or an alkaline earth metal. The first layer includes an electron-transport material.

Another embodiment of the invention disclosed in this specification is a light-emitting element including a cathode, a first layer over the cathode, a second layer over the first layer, a light-emitting layer over the second layer, an anode over the light-emitting layer, and a third layer. The third layer is between the cathode and the first layer. The third layer includes a hole-transport material and an electron acceptor. The second layer includes an alkali metal or an alkaline earth metal. The first layer includes an electron-transport material.

In the light-emitting element according to one embodiment of the invention disclosed in this specification, the first layer may be capable of suppressing diffusion of the alkali metal or the alkaline earth metal into the cathode.

In the light-emitting element according to one embodiment of the invention disclosed in this specification, the electron-transport material may include bathophenanthroline (BPhen) or tris(8-quinolinolato)aluminum ($Alq_3$). The alkali metal or the alkaline earth metal may be lithium or calcium.

In the light-emitting element according to one embodiment of the invention disclosed in this specification, the anode may include oxygen, tin, and indium. Note that the cathode may include a conductive material containing oxygen. The cathode may include a material having a light-transmitting property. The cathode may include indium, tin, and oxygen.

In a light-emitting device including the light-emitting element according to one embodiment of the invention disclosed in this specification and a field-effect transistor, the cathode may be electrically connected to the field-effect transistor. Note that the field-effect transistor may be an n-channel field-effect transistor. The field-effect transistor may include an oxide semiconductor in a semiconductor layer. The oxide semiconductor may include indium, tin, and gallium.

An electronic appliance may include the light-emitting element according to one embodiment of the invention disclosed in this specification or the light-emitting device according to one embodiment of the invention disclosed in this specification, and a color filter. Alternatively, another electronic appliance may include the light-emitting element according to one embodiment of the invention disclosed in this specification or the light-emitting device according to one embodiment of the invention disclosed in this specification, and a touch panel. Further alternatively, a lighting device may include the light-emitting element according to one embodiment of the invention disclosed in this specification or the light-emitting device according to one embodiment of the invention disclosed in this specification, and a housing.

In the inverted-structure light-emitting element, contact of the alkali metal or alkaline earth metal included in a material of the electron-injection layer with the already formed cathode increases the driving voltage of an EL element and reduces emission efficiency. This problem becomes prominent particularly when the cathode includes an oxide conductive film. To prevent this, a layer serving as a buffer (hereinafter also simply referred to as a layer) is provided between the cathode and the electron-injection layer.

Using, for example, an electron-transport material for the layer improves the conductivity of the layer even if metal is diffused to the layer. Thus, in contrast to an element not including this layer, the inverted-structure light-emitting element can emit light without an increase in its driving voltage.

According to one embodiment of the present invention, a novel light-emitting element can be provided. According to one embodiment of the present invention, a novel structure of a light-emitting element can be provided. According to one embodiment of the present invention, a novel inverted-structure light-emitting element can be provided.

Note that the description of these effects does not disturb the existence of other effects. In one embodiment of the present invention, there is no need to obtain all the above effects. Other effects are apparent from and can be derived from the description of the specification, the drawings, the claims, and the like.

BRIEF DESCRIPTION OF THE DRAWINGS

In the accompanying drawings:
FIGS. 4A to 4D illustrate electronic appliances;
FIG. 14 illustrates a light-emitting device of one embodiment of the present invention;
FIGS. 15A to 15E illustrate light-emitting devices of one embodiment of the present invention.

DETAILED DESCRIPTION OF THE INVENTION

Figure 1:
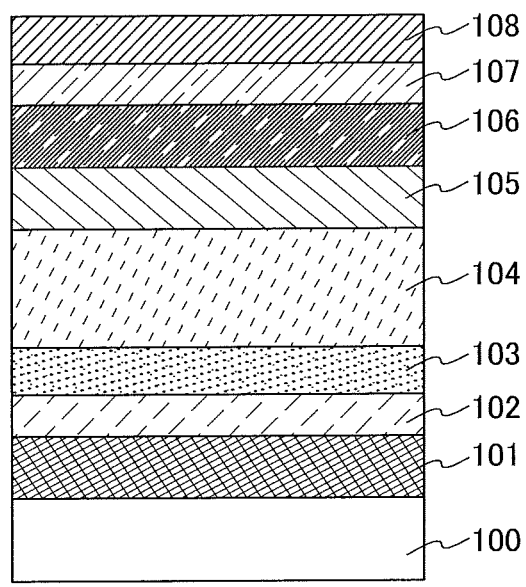
FIG. 1 illustrates a structure of a light-emitting element.

Embodiments of the present invention will be described below in detail with reference to the accompanying drawings. However, the present invention is not limited to the description below, and it is easily understood by those skilled in the art that modes and details disclosed herein can be modified in various ways. Furthermore, the present invention is not construed as being limited to the description of the embodiments and the examples.

Note that in each drawing described in this specification, the size, the thickness, and the like of each component such as an anode, an EL layer, an intermediate layer, and a cathode is exaggerated for clarity in some cases. Therefore, the sizes of the components are not limited to the sizes in the drawings and relative sizes between the components.

Ordinal numbers such as "first", "second", and "third" are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that in the structures of the present invention described in this specification and the like, the same portions or portions having similar functions in different drawings are denoted by the same reference numerals, and description of such portions is not repeated. Furthermore, the same hatching pattern is applied to portions having similar functions, and the portions are not especially denoted by reference numerals in some cases.

In this specification, color is defined by three aspects of hue (corresponding to the wavelength of light of a single color), chroma (saturation, i.e., the degree to which it differs from white), and value (brightness, i.e., the intensity of light). In this specification, color may be defined by only one of the above three aspects or two of the aspects which are selected arbitrarily. In this specification, a difference between two colors of light means a difference in at least one of the above three aspects and includes a difference in the shapes of two spectra of light or in the distributions of the relative intensity of the peaks in the spectra.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

[Embodiment 1]

In this embodiment, a light-emitting element of one embodiment of the present invention will be described with reference to FIG. 1.

FIG. 1 illustrates an EL element in which an EL layer including a light-emitting layer 105 is provided between a cathode 101 and an anode 108. Although the number of EL layers is one in this embodiment, a tandem structure in which two or more EL layers are stacked may be employed. The cathode 101 is formed over a substrate 100; a layer 102 is formed over the cathode 101; an electron-injection layer 103 is formed over the layer 102; and an electron-transport layer 104, the light-emitting layer 105, a hole-transport layer 106, a hole-injection layer 107, and the anode 108 are formed in this order over the electron-injection layer 103; thus, the light-emitting element is formed. A field effect transistor (FET) may be formed between the substrate 100 and the cathode 101, and a signal supplied from the field effect transistor (FET) is input to the cathode 101.

The cathode 101 is formed over the substrate 100. For the cathode 101, any of a variety of metals, alloys, other conductive materials, and a mixture thereof or the like can be used. For example, an oxide conductive film such as indium oxide-tin oxide (ITO: indium tin oxide), indium oxide-tin oxide containing silicon or silicon oxide, indium oxide-zinc oxide (IZO: indium zinc oxide), or indium oxide containing tungsten oxide and zinc oxide, which has a high work function, can be used. Such oxide conductive films can be formed by a sputtering method or a sol-gel method or the like. For example, indium oxide-zinc oxide (indium zinc oxide) can be formed by a sputtering method using a target obtained by adding zinc oxide to indium oxide at 1 wt % to 20 wt %. A film of indium oxide containing tungsten oxide and zinc oxide can be formed by a sputtering method using a target obtained by adding tungsten oxide and zinc oxide at 0.5 wt % to 5 wt % and 0.1 wt % to 1 wt %, respectively, to indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. A rare earth metal such as europium (Eu) or ytterbium (Yb), an alloy of any of these metals, or the like can be used. Aluminum (Al), silver (Ag), an alloy containing aluminum (AlSi), or the like can be used. The cathode is not limited to a single-layer film and may be a stacked-layer film.

The anode 108 is formed over the EL layer. To function as the anode, it is preferably formed using any of metals, alloys, conductive compounds with a high work function (specifically, a work function of 4.0 eV or more), mixtures thereof, and the like. Specifically, for example, indium oxide-tin oxide (ITO: indium tin oxide), indium oxide-tin oxide containing silicon or silicon oxide, indium oxide-zinc oxide, and indium oxide containing tungsten oxide and zinc oxide can be given. Such conductive metal oxide films are usually formed by a sputtering method, but may be formed by application of a sol-gel method or the like. In an example of the formation method, indium oxide-zinc oxide is formed by a sputtering method using a target obtained by adding zinc oxide to indium oxide at 1 wt % to 20 wt %. A film of indium oxide containing tungsten oxide and zinc oxide can be formed by a sputtering method using a target obtained by adding tungsten oxide and zinc oxide at 0.5 wt % to 5 wt % and 0.1 wt % to 1 wt %, respectively, to indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride thereof (e.g., titanium nitride), and the like can be given. Graphene can also be used.

When the anode 108 is formed with a material having a light-transmitting property, the light-emitting element can have a top emission structure. When the anode 108 is formed with a reflective material not having a light-transmitting property and the cathode 101 has a light-transmitting property, the light-emitting element can have a bottom emission structure.

A structure of the EL layer is next described.

<<Structure of EL Layer>>

The EL layer includes at least a light-emitting layer including a light-emitting substance. In the inverted structure, an electron-injection layer, an electron-transport layer, a light-emitting layer, a hole-transport layer, and a hole-injection layer are formed in this order from the cathode side. Each layer is not necessarily a single layer and may be formed of two or more layers. One layer may serve as the electron-injection layer and as the electron-transport layer, and one layer may serve as the hole-transport layer and the hole-injection layer. One or more layers other than the light-emitting layer may be omitted.

The electron-injection layer 103 is described. The electron-injection layer 103 is first formed on the cathode side of the EL layer. The electron-injection layer 103 is a layer containing a substance having a high electron-injection property. For the electron-injection layer 103, an alkali metal, an alkaline earth metal, or a compound of the metal such as lithium fluoride (LiF), cesium fluoride (CsF), calcium fluoride (CaF$_2$), or lithium oxide (LiO$_x$) can be used. A rare earth metal compound such as erbium fluoride (ErF$_3$) can be used. Any of the above substances that can form the electron-transport layer can be used.

Alternatively, a composite material in which an organic compound and an electron donor (donor) are mixed may be used for the electron-injection layer 103. Such a composite material is excellent in an electron-injection property and an electron-transport property because electrons are generated in the organic compound by the electron donor. In this case, the organic compound is preferably a material that is excellent in transporting the generated electrons. Specifically, for example, the substances that can form the electron-transport layer (e.g., a metal complex or a heteroaromatic compound), which are described below, can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, and barium oxide can be given. Alternatively, Lewis base such as magnesium oxide can also be used. An organic compound such as tetrathiafulvalene (abbreviation: TTF) can also be used.

The electron-transport layer 104 is formed over the electron-injection layer 103. The electron-transport layer 104 is a layer containing a substance having a high electron-transport property. For the electron-transport layer 104, a metal complex such as $Alq_3$, tris(4-methyl-8-quinolinolato) aluminum(III) (abbreviation: $Almq_3$), bis(10-hydroxybenzo [h]quinolinato)beryllium(II) (abbreviation: $BeBq_2$), bis(2-methyl-8-quinolinolato)(4-phenylphenolato)aluminum(III) (abbreviation: BAlq), bis[2-(2-benzoxazolyl)phenolato]zinc (II) (abbreviation: ZnPBO), or bis[2-(2-benzothiazolyl)phenolato]zinc(II) (abbreviation: ZnBTZ) can be used. Furthermore, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), BPhen, bathocuproine (abbreviation: BCP), or 4,4'-bis(5-methylbenzoxazol-2-yl)stilbene (abbreviation: BzOs) can also be used. Furthermore, alternatively, it is possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy). The substances mentioned here are mainly ones that have an electron mobility of $10^{-6}$ cm$^2$/Vs or more. Note that any substance other than the above substances may be used for the electron-transport layer 104 as long as the electron-transport property is higher than the hole-transport property.

Furthermore, the electron-transport layer 104 is not limited to a single layer and may be a stack of two or more layers each containing the aforementioned substance.

Over the electron-transport layer 104, the light-emitting layer 105 is formed. The light-emitting layer 105 is a layer containing a light-emitting substance. The light-emitting layer 105 may contain only a light-emitting substance; alternatively, a light-emitting substance may be diffused in a host material.

There is no particular limitation on materials that can be used as the light-emitting substance, and light emitted from these substances may be either fluorescence or phosphorescence. Examples of the light-emitting substance are given below.

Examples of the substance emitting phosphorescence include bis{2-[3',5'-bis(trifluoromethyl)phenyl]pyridinato-N,C$^{2'}$}iridium(III) picolinate (abbreviation: Ir(CF$_3$ppy)$_2$ (pic)), bis[2-(4',6'-difluorophenyl)pyridinato-N,C$^{2'}$]iridium (III) acetylacetonate (abbreviation: FIr(acac)), tris(2-phenylpyridinato)iridium(III) (abbreviation: Ir(ppy)$_3$), bis (2-phenylpyridinato)iridium(III) acetylacetonate (abbreviation: Ir(ppy)$_2$(acac)), tris(acetylacetonato) (monophenanthroline)terbium(III) (abbreviation: Tb(acac)$_3$ (Phen)), bis(benzo[h]quinolinato)iridium(III) acetylacetonate (abbreviation: Ir(bzq)$_2$(acac)), bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), bis(2-phenylbenzothiazolato-N,C$^{2'}$)iridium (III) acetylacetonate (abbreviation: Ir(bt)$_2$(acac)), bis[2-(2'-benzo[4,5-α]thienyl)pyridinato-N,C$^{2'}$]iridium(III) acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq) $_2$(acac)), (acetylacetonato)bis(3,5-dimethyl-2-phenylpyrazinato)iridium(III) (abbreviation: [Ir(mppr-Me)$_2$ (acac)]), (acetylacetonato)bis(5-isopropyl-3-methyl-2-phenylpyrazinato)iridium(III) (abbreviation: [Ir(mppr-iPr)$_2$ (acac)]), (acetylacetonato)bis(2,3,5-triphenylpyrazinato) iridium(III) (abbreviation: Ir(tppr)$_2$(acac)), bis(2,3,5-triphenylpyrazinato)(dipivaloylmethanato)iridium(III) (abbreviation: [Ir(tppr)$_2$(dpm)]), (acetylacetonato)bis(6-tert-butyl-4-phenylpyrimidinato)iridium(III) (abbreviation: [Ir (tBuppm)$_2$(acac)]), (acetylacetonato)bis(4,6-diphenylpyrimidinato)iridium(III) (abbreviation: [Ir(dppm)$_2$(acac)]), 2,3,7,8,12,13,17,18-octaethyl-21H,23H-porphyrin platinum (II) (abbreviation: PtOEP), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

Although there is no particular limitation on a material that can be used as the host material described above, any of the following substances can be used for the host material, for example: metal complexes such as tris(8-quinolinolato) aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1, 3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB), N,N'-bis(3-methylphenyl)-N,N'-diphenyl-[1, 1'-biphenyl]-4,4'-diamine (abbreviation: TPD), and 4,4'-bis [N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be used. Specific examples of the condensed polycyclic aromatic compound include 9,10-diphenylanthracene (abbreviation: DPAnth), N,N-diphenyl-9-[4-(10-phenyl-9-anthryl) phenyl]-9H-carbazol-3-amine (abbreviation: CzA1 PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA),N,9-diphenyl-N-{4-[4-(10-phenyl-9-anthryl)phenyl]phenyl}-9H-carbazol-3-amine (abbreviation: PCAPBA), 9,10-diphenyl-2-[N-phenyl-N-(9-phenyl-9H-carbazol-3-yl)amino]anthracene (abbrevoatopm: 2PCAPA), 6,12-dimethoxy-5,11-diphenylchrysene, N,N,N',N',N'',N''',N'''',N''''-octaphenyldibenzo[g,p]chrysene-2,7,10,15-tetraamine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a wider energy gap than the light-emitting substance described above is preferably selected from these substances and known substances. Moreover, in the case where the light-emitting substance emits phosphorescence, a substance having triplet excitation energy (energy difference between a ground state and a triplet excited state) which is higher than that of the light-emitting substance is preferably selected as the host material.

The light-emitting layer 105 may have a structure in which two or more layers are stacked. For example, in the case where the light-emitting layer 105 is formed by stacking a first light-emitting layer and a second light-emitting layer in this order from the electron-transport layer 104 side, the first light-emitting layer is formed using a substance having an electron-transport property as the host material and the second light-emitting layer is formed using a substance having a hole-transport property as the host material.

Over the light-emitting layer 105, the hole-transport layer 106 is formed. Examples of the substance having a high hole-transport property used for the hole-transport layer 106 are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N'-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Alternatively, the following carbazole compound can be used: 4,4'-di(N-carbazolyl)biphenyl (abbreviation: CBP), 1,3,5-tris[4-(N-carbazolyl)phenyl]benzene (abbreviation: TCPB), and CzPA. These materials described here are mainly substances having a hole mobility of $10^{-6}$ cm$^2$/Vs or more. Note that any substance other than the above substances may be used as long as the hole-transport property is higher than the electron-transport property.

A high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used.

Over the hole-transport layer 106, the hole-injection layer 107 is formed. The hole-injection layer 107 is a layer containing a substance having a high hole-injection property. As the substance having a high hole-injection property, for example, molybdenum oxide, vanadium oxide, ruthenium oxide, tungsten oxide, or manganese oxide can be used. Alternatively, the hole-injection layer 107 can be formed using a phthalocyanine-based compound such as phthalocyanine (abbreviation: H$_2$Pc) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), a high molecular compound such as poly(3,4-ethylenedioxythiophene)/poly(styrenesulfonic acid) (PEDOT/PSS), or the like.

Alternatively, for the hole-injection layer 107, a composite material in which a substance having a hole-transport property contains a substance having an acceptor property can be used. Note that the use of such a substance having a hole-transport property which contains a substance having an acceptor property enables selection of a material used to form an electrode regardless of its work function. In other words, besides a material having a high work function, a material having a low work function can be used for the hole-injection layer 107. As the substance having an acceptor property, 7,7,8,8-tetracyano-2,3,5,6-tetrafluoroquinodimethane (abbreviation: F$_4$-TCNQ), chloranil, or the like can be given. In addition, transition metal oxides can be given. Moreover, an oxide of the metals belonging to Groups 4 to 8 of the periodic table can be given. Specifically, it is preferable to use vanadium oxide, niobium oxide, tantalum oxide, chromium oxide, molybdenum oxide, tungsten oxide, manganese oxide, and rhenium oxide because of their high electron accepting properties. In particular, molybdenum oxide is more preferable because of its stability in the atmosphere, low hygroscopic property, and easiness of handling.

As the substance having a hole-transport property which is used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, use of a substance having a hole mobility greater than or equal to $10^{-6}$ cm$^2$/Vs is preferable. Organic compounds that can be used as the substance having a hole-transport property in the composite material are specifically given below.

Examples of the aromatic amine compounds are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivatives that can be used for the composite material are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbons that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. The aromatic hydrocarbon which has a hole mobility of $1 \times 10^{-6}$ cm$^2$/Vs or more and which has 14 to 42 carbon atoms is particularly preferable.

Note that the aromatic hydrocarbons that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: poly-TPD) can also be used.

By providing the hole-injection layer 107, a high hole-injection property can be achieved to allow the light-emitting element to be driven at a low voltage.

As described above, the electron-injection layer 103, the electron-transport layer 104, the light-emitting layer 105, the hole-transport layer 106, and the hole-injection layer 107 are formed in this order from the cathode 101 side; thus, the EL layer is formed. Note that although the light-emitting layer is indispensable to the EL layer, one or more layers other than the light-emitting layer may be omitted. The materials or thicknesses of the plurality of EL layers formed in the tandem light-emitting element can be the same or different or can be partly the same or different.

<<Layer Between Cathode and Electron-Injection Layer>>

According to one embodiment of the present invention, the layer 102 is formed between the cathode 101 and the electron-injection layer 103. The layer 102 has a function of preventing direct contact of the alkali metal or alkaline earth metal, which is contained in the material for forming the electron-injection layer 103, with the cathode 101.

In an ordered-structure light-emitting element having, for example, a top emission structure, a cathode having a light-transmitting property for emitting light from the element to the outside is formed using a material such as a silver-magnesium alloy (AgMg), which has a relative low work function and can inject electrons easily. The work function of such a material is relatively close to the work function of the alkali metal or alkaline earth metal used for the electron-injection layer; therefore, carrier injection from the cathode to the electron-injection layer is performed relatively easily.

In contrast, in an inverted-structure light-emitting element, where a cathode is formed using, for example, a transparent conductive oxide material such as ITO, which has relatively high Fermi level, an energy barrier is formed between the electron-injection layer containing an alkali metal or an alkaline earth metal and the cathode which are in contact with each other and therefore injection of electrons from the cathode is inhibited. Accordingly, this structure causes a problem of high driving voltage, low power efficiency, and a short lifetime.

Thus, in the inverted-structure light-emitting element of one embodiment of the present invention, the layer 102 is provided between the cathode 101 and the electron-injection layer 103. Note that the layer 102 has a function of preventing contact of the alkali metal or alkaline earth metal with the cathode and serves as a buffer relieving a carrier-injection barrier. Owing to the function of the layer 102, carriers are easily injected from the cathode to the EL layer; thus, the driving voltage of the light-emitting element can be lowered, the power efficiency of the element can be improved, and the lifetime can be extended. Therefore, the inverted-structure light-emitting element can have favorable characteristics.

The layer 102 having a function of preventing contact of the alkali metal or alkaline earth metal with the cathode preferably contains a material having a high electron-transport property, particularly preferably an organic compound material that enables the alkali metal or alkaline earth metal to function as an electron donor (donor) when the alkali metal or alkaline earth metal is diffused and taken into the layer 102. A composite material in which the alkali metal or alkaline earth metal is mixed with such an organic compound material to serve as an electron donor (donor) has excellent electron-injection and electron-transport properties because electrons are generated in the organic compound by the electron donor (donor). Therefore, electron-injection and electron-transport properties which are necessary for the light-emitting element can be secured even when the layer 102 is provided between the cathode 101 and the electron-injection layer 103. In consideration of such a function of the layer 102, the layer 102 and the electron-injection layer 103 can be regarded as two electron-injection layers in some cases.

Specifically, a metal complex such as Alq$_3$, Almq$_3$, BeBq$_2$, BAlq, ZnPBO, or ZnBTZ can be used as a specific material of the layer 102. Furthermore, a heteroaromatic compound such as PBD, OXD-7, TAZ, 3-(4-tert-butylphenyl)-4-(4-ethylphenyl)-5-(4-biphenylyl)-1,2,4-triazole (abbreviation: p-EtTAZ), BPhen, BCP, or 4,4'-bis(5-methylbenzoxazol-2-yl)stilbene (abbreviation: BzOs) can also be used. Furthermore, alternatively, it is possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy). The materials mentioned here are mainly ones that have an electron mobility of $10^{-6}$ cm$^2$/Vs or more.

The material of the layer 102 can be different from that of the electron-injection layer 103. When a material which is different from that of the electron-injection layer 103 is used for the layer 102, the range of choices for the performance of the electron-injection and electron-transport properties can be extended. The layer 102 may be formed by mixing two or more kinds of the above materials. The layer 102 is not limited to a single layer and may be a stacked layer of two or more layers. Another layer besides the layer 102 may be formed between the cathode 101 and the electron-injection layer 103. Note that the layer 102 may be formed in a region in which the metal contained in the electron-injection layer 103 can be diffused to have functions of preventing contact between the metal and the cathode 101 and preventing diffusion of the metal. In other words, a distance between the layer 102 and the electron-injection layer 103 may be shorter than a distance of the region in which the metal can be diffused. To enhance the function of preventing contact between the metal and the cathode 101 more certainly and to reduce a region in which the metal is diffused, it is preferable that the layer 102 and the electron-injection layer 103 be in contact with each other, as illustrated in FIG. 1. Moreover, to shorten a travel distance of carriers, it is preferable that a layer other than the layer 102 be not formed between the cathode 101 and the electron-injection layer 103.

When the layer 102 is a stacked layer of two or more layers, as long as at least one of the layers is formed using a material having a high electron-transport property, the other layers can be formed using a variety of materials. It is known that the light path in the light-emitting element affects the wavelength of light emitted from the light-emitting element; however, optical adjustment for extracting desired light can be performed on the light-emitting element using a material having a light-transmitting property and high conductivity for the other layers of the layer 102. For example, the other layers of the layer 102 may be formed by adding an electron acceptor (acceptor) to an organic compound having a high hole-transport property.

Examples of the substance having a high hole-transport property include an aromatic amine such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), 3,3'-bis(9-phenyl-9H-carbazole) (abbreviation: PCCP), N-[4-(9H-carbazol-9-yl)phenyl]-N-(4-phenyl)phenylaniline (abbreviation: YGA1BP), 1,3,5-tri(dibenzothiophen-4-yl)-benzene (abbreviation: DBT3P-II), 4,4',4''-(benzene-1,3,5-triyl)tri(dibenzofuran) (abbreviation: DBF3P-II), 4-phenyl-4'-(9-phenylfluoren-9-yl)triphenylamine (abbreviation: BPAFLP), 4-[3-(triphenylen-2-yl)phenyl]dibenzothiophene (abbreviation: mDBTPTp-II), 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N'-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1,3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1). Other examples include carbazole compounds such as 4,4'-di(N-carbazolyl)biphenyl (abbreviation: CBP) and 1,3,5-tris[4-(N-carbazolyl)phenyl]benzene (abbreviation: TCPB); amine compounds; dibenzothiophene compounds; dibenzofuran compounds; fluorene compounds; triphenylene compounds; and phenanthrene compounds.

As the electron acceptor (acceptor), a transition metal oxide and an oxide of a metal belonging to any one of Groups 4 to 8 of the periodic table can be given. Specifically, molybdenum oxide is particularly preferable.

Figure 2:
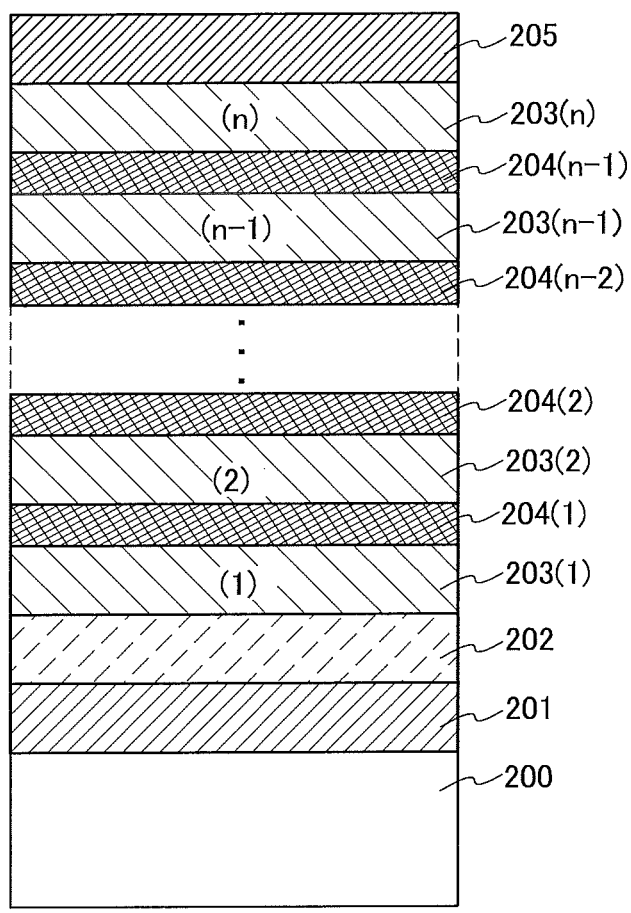
FIG. 2 illustrates a structure of a light-emitting element.

As illustrated in FIG. 2, in a tandem EL light-emitting element in which n EL layers 203 (n is a natural number of 2 or more) are provided between the cathode 201 and the anode 205 and an intermediate layer 204 is provided between every two EL layers 203, the layer 202 having a function of preventing contact of an alkali metal or an alkaline earth metal with the cathode can be provided. Note that the EL layer includes at least a light-emitting layer and further includes all or some of an electron-injection layer, an electron-transport layer, a hole-transport layer, and a hole-injection layer.

In this embodiment, the light-emitting element in which the EL layer is formed over the cathode and the anode is formed over the EL layer is described. However, as long as the cathode is formed using a material having relatively high Fermi level and the electron-injection layer includes an alkali metal or an alkaline earth metal, the light-emitting element can have low driving voltage, improved power efficiency, and a long lifetime by including the layer having a function of preventing contact of the alkali metal or alkaline earth metal with the cathode between the cathode and the electron-injection layer.

According to one embodiment of the present invention, the inverted-structure EL light-emitting element having favorable characteristic, whose degradation of the performance is inhibited, can be formed.

[Embodiment 2]

In this embodiment, a light-emitting device including the light-emitting element described in Embodiment 1 will be described.

The light-emitting device may be either a passive matrix type light-emitting device or an active matrix type light-emitting device. The light-emitting element described in an embodiment other than Embodiment 1 can be applied to the light-emitting device described in this embodiment.

In this embodiment, an active matrix type light-emitting device is described with reference to FIGS. 3A and 3B.

Figure 3A:
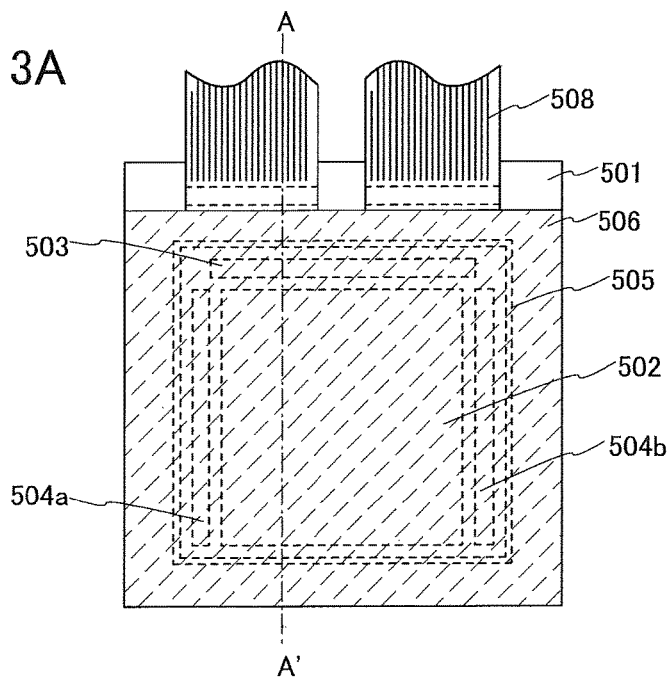
FIGS. 3A and 3B illustrate a light-emitting device.
Figure 3B:
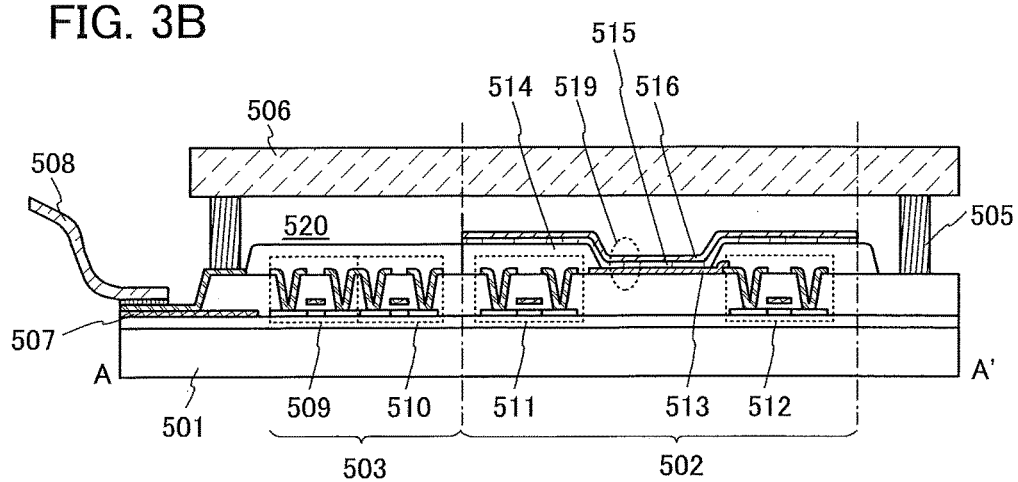

FIG. 3A is a top view illustrating a light-emitting device and FIG. 3B is a cross-sectional view taken along the chain line A-A' in FIG. 3A. The active matrix type light-emitting device according to this embodiment includes a pixel portion 502 provided over an element substrate 501, a driver circuit portion (a source line driver circuit) 503, and driver circuit portions (gate line driver circuits) 504a and 504b. The pixel portion 502, the driver circuit portion 503, and the driver circuit portion 504a and 504b are sealed with a sealant 505 between the element substrate 501 and a sealing substrate 506.

In addition, over the element substrate 501, a lead wiring 507 for connecting an external input terminal, through which a signal (e.g., a video signal, a clock signal, a start signal, or a reset signal) or electric potential from the outside is transmitted to the driver circuit portion 503 and the driver circuit portions 504a and 504b, is provided. Here, an example is described in which a flexible printed circuit (FPC) 508 is provided as the external input terminal. Although only the FPC is illustrated here, the FPC may be provided with a printed wiring board (PWB). The light-emitting device in this specification includes, in its category, not only the light-emitting device itself but also the light-emitting device provided with the FPC or the PWB.

Next, a cross-sectional structure is described with reference to FIG. 3B. The driver circuit portion and the pixel portion are formed over the element substrate 501; the driver circuit portion 503 which is the source line driver circuit and the pixel portion 502 are illustrated here.

The driver circuit portion 503 is an example where a CMOS circuit is formed, which is a combination of an n-channel FET 509 and a p-channel FET 510. Note that a circuit included in the driver circuit portion may be formed using various CMOS circuits, PMOS circuits, or NMOS circuits. Any of a staggered type FET and a reverse-staggered type FET can be used. The crystallinity of a semiconductor film used in the FET is not limited and can be amorphous or crystalline. In addition, an oxide semiconductor may be used for a semiconductor layer. Although a driver integrated type in which the driver circuit is formed over the substrate is described in this embodiment, the driver circuit is not necessarily formed over the substrate, and the driver circuit can be formed outside.

The pixel portion 502 is formed of a plurality of pixels each of which includes a switching FET 511, a current control FET 512, and a cathode 513 which is electrically connected to a wiring (a source electrode or a drain electrode) of the current control FET 512. An insulator 514 is formed to cover edge portions of the cathode 513. Here the insulator 514 is formed using a positive photosensitive acrylic resin.

The insulator 514 preferably has a curved surface with curvature at an upper edge portion or a lower edge portion thereof in order to obtain favorable coverage by a film which is to be stacked over the insulator 514. For example, in the case of using a positive photosensitive acrylic resin as a material for the insulator 514, the insulator 514 is preferably formed so as to have a curved surface with a curvature radius (0.2 µm to 3 µm) at the upper edge portion. The insulator 514 can be formed using either a negative photosensitive resin or a positive photosensitive resin. The material of the insulator 514 is not limited to an organic compound and an inorganic compound such as silicon oxide or silicon oxynitride can also be used.

Over the cathode 513, an EL layer 515 and an anode 516 are stacked. At least a light-emitting layer is provided in the EL layer 515. Furthermore, in the EL layer 515, a hole-injection layer, a hole-transport layer, an electron-transport layer, an electron-injection layer, and the like can be provided as appropriate in addition to the light-emitting layer. Moreover, a layer having a function of suppressing movement of an alkali metal or an alkaline earth metal can be provided between the electron-injection layer and the cathode 513. Note that the components including the cathode 513 to the anode 516 can be considered as the light-emitting element described in Embodiment 1.

Not that for the cathode 513, the EL layer 515, and the anode 516, the materials described in Embodiment 1 can be used. Although not illustrated, the anode 516 is electrically connected to an FPC 508 which is an external input terminal.

In addition, although the cross-sectional view of FIG. 3B illustrates only one light-emitting element 519, a plurality of light-emitting elements are arranged in a matrix in the pixel portion 502. Light-emitting elements that emit light of three kinds of colors (R, G, and B) are selectively formed in the pixel portion 502, whereby a light-emitting device capable of full color display can be obtained. Alternatively, a light-emitting device capable of full color display may be fabricated by a combination with color filters.

Furthermore, the sealing substrate 506 is attached to the element substrate 501 with the sealant 505, whereby the light-emitting element 519 is provided in a space 520 surrounded by the element substrate 501, the sealing substrate 506, and the sealant 505. Note that the space 520 may be filled with an inert gas (such as nitrogen and argon) or the sealant 505.

An epoxy-based resin is preferably used for the sealant 505. The material preferably allows as little moisture and oxygen as possible to penetrate. As the sealing substrate 506, a glass substrate, a quartz substrate, or a plastic substrate formed of fiber-reinforced plastic (FRP), polyvinyl fluoride) (PVF), a polyester, acrylic, or the like can be used.

Note that in this specification and the like, a transistor and a light-emitting element can be formed using any of a variety of substrates. The type of a substrate is not limited to a certain type. Examples of the substrate are a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of the flexible substrate, the attachment film, the base film, and the like are substrates of plastics typified by polyethylene terephthalate (PET), polyethylene naphthalate (PEN), and polyether sulfone (PES). Other examples are substrates of synthetic resins such as acrylic. Other examples are polypropylene, polyester, polyvinyl fluoride, polyvinyl chloride, and the like. Other examples are polyamide, polyimide, aramid, epoxy, an inorganic vapor deposition film, paper, and the like. In particular, when a transistor is formed using a semiconductor substrate, a single crystal substrate, an SOI substrate, or the like, the transistor can have few variations in characteristics, size, shape, or the like, high current supply capability, and a small size. Forming a circuit with the use of such transistors leads to a reduction in power consumption of the circuit or high integration of the circuit.

Alternatively, a flexible substrate may be used as the substrate such that the transistor and the light-emitting element may be provided directly on the flexible substrate. Still alternatively, a separation layer may be provided between the substrate and the transistor and between the substrate and the light-emitting element. The separation layer can be used when part or the whole of a semiconductor device formed over the separation layer is separated from the substrate and transferred onto another substrate. In such a case, the transistor and the light-emitting element can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, after the transistor and the light-emitting element is formed using a substrate, the transistor and the light-emitting element may be transferred to another substrate. Example of the substrate to which the transistor and the light-emitting element are transferred are, in addition to the above substrate over which the transistor and the light-emitting element can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent properties, a transistor with low power consumption, or a device with high durability, high heat resistance, or a reduction in weight or thickness.

As described above, the active matrix type light-emitting device can be obtained.

Note that the structure described in this embodiment can be combined as appropriate with any of the structures described in the other embodiments and the examples.

[Embodiment 3]

In this embodiment, examples of a variety of electronic appliances fabricated using a light-emitting device including the light-emitting element described in Embodiment 1 will be described with reference to FIGS. 4A to 4D.

Examples of electronic appliances that include the light-emitting device are television devices (also referred to as TV or television receivers), monitors for computers and the like, cameras such as digital cameras and digital video cameras, digital photo frames, cellular phones (also referred to as portable telephone devices), portable game consoles, portable information terminals, audio playback devices, large game machines such as pin-ball machines, and the like. Specific examples of these electronic appliances are illustrated in FIGS. 4A to 4D.

FIG. 4A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105. Note that the display portion 7103 includes the light-emitting device in which the light-emitting elements described in Embodiment 1 are arranged in a matrix.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wirings via the modem, one-way (from a sender to a receiver) or two-way (between a sender and a receiver or between receivers) information communication can be performed.

FIG. 4B illustrates a computer, which includes a main body 7201, a housing 7202, a display portion 7203, a keyboard 7204, an external connection port 7205, a pointing device 7206, and the like. Note that this computer is manufactured using the light-emitting device for the display portion 7203. Note that the display portion 7203 includes the light-emitting device in which the light-emitting elements described in Embodiment 1 are arranged in a matrix.

FIG. 4C illustrates a portable game console, which includes two housings, i.e., a housing 7301 and a housing 7302, connected to each other via a joint portion 7303 so that the portable game console can be opened or closed. A display portion 7304 is incorporated in the housing 7301 and a display portion 7305 is incorporated in the housing 7302. Note that the display portions 7304 and 7305 include the light-emitting device in which the light-emitting elements described in Embodiment 1 are arranged in a matrix.

In addition, the portable game console illustrated in FIG. 4C includes a speaker portion 7306, a recording medium insertion portion 7307, an LED lamp 7308, an input means (an operation key 7309, a connection terminal 7310, a microphone 7312, a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and the like. It is needless to say that the structure of the portable game console is not limited to the above as long as the light-emitting device is used for at least either the display portion 7304 or the display portion 7305, or both, and may include other accessories as appropriate.

The portable game console illustrated in FIG. 4C has a function of reading out a program or data stored in a storage medium to display it on the display portion, and a function of sharing information with another portable game console by wireless communication. Note that the portable game console illustrated in FIG. 4C can have a variety of functions without limitation thereon.

FIG. 4D illustrates an example of a cellular phone. A cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using the light-emitting device for the display portion 7402. Note that the display portion 7402 includes the light-emitting device in which the light-emitting elements described in Embodiment 1 are arranged in a matrix.

When the display portion 7402 of the cellular phone 7400 illustrated in FIG. 4D is touched with a finger or the like, data can be input into the cellular phone 7400. In addition, operations such as making a call and composing an e-mail can be performed by touch on the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or composing an email, a character input mode mainly for inputting characters is selected for the display portion 7402 so that characters displayed on the screen can be input. In this case, it is preferable to display a keyboard or number buttons on almost the entire screen of the display portion 7402.

When a detection device such as a gyro sensor or an acceleration sensor is provided inside the cellular phone 7400, display on the screen of the display portion 7402 can be automatically changed by determining the orientation of the cellular phone 7400 (whether the cellular phone is placed horizontally or vertically).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when it is determined that input by touch on the display portion 7402 is not performed within a specified period on the basis of a signal detected by an optical sensor in the display portion 7402, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. In addition, when a sensing light source which emits near-infrared light is provided in the display portion, an image of a finger vein, a palm vein, or the like can be taken.

Figure 5A:
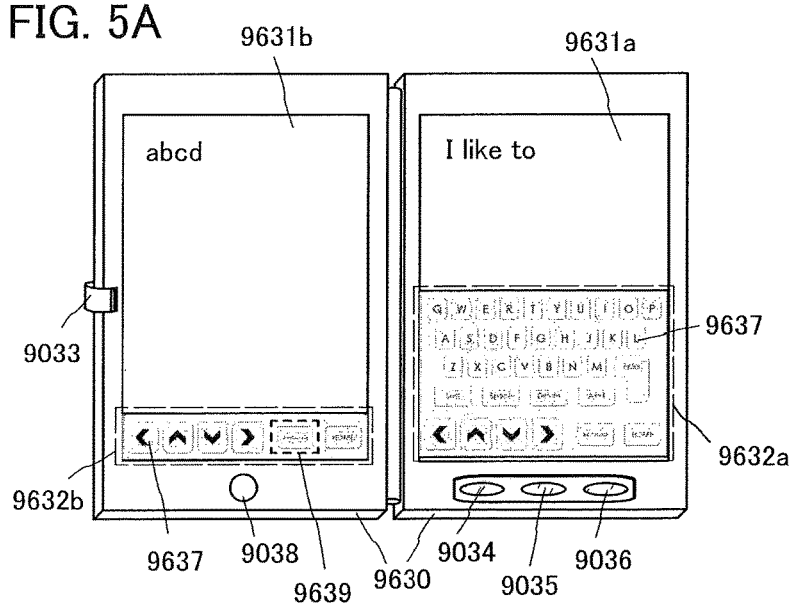
FIGS. 5A to 5C illustrate an electronic appliance.
Figure 5B:
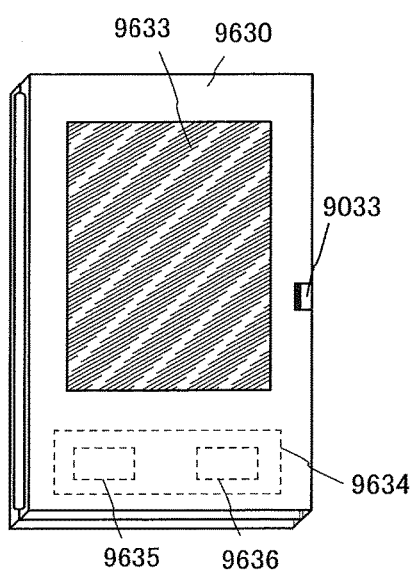

FIGS. 5A and 5B illustrate a foldable tablet terminal. The tablet terminal is opened in FIG. 5A. The tablet terminal includes a housing 9630, a display portion 9631a, a display portion 9631b, a display mode switch 9034, a power switch 9035, a switch 9036 for switching to power-saving mode, a clasp 9033, and an operation switch 9038. The tablet terminal is manufactured using the light-emitting device for either the display portion 9631a or the display portion 9631b or both. Note that one or both of the display portions 9631a and 9631b include a light-emitting device in which the light-emitting elements described in Embodiment 1 are arranged in a matrix.

Part of the display portion 9631a can be a touch panel region 9632a and data can be input when a displayed operation key 9637 is touched. Although a structure in which a half region in the display portion 9631a has only a display function and the other half region has a touch panel function is shown as an example, the display portion 9631a is not limited to the structure. The whole region in the display portion 9631a may have a touch panel function. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

With the switch 9034 for switching display modes, the display orientation can be switched (e.g., between landscape mode and portrait mode) and a display mode (e.g., monochrome display or color display) can be selected. The switch 9036 for switching to power-saving mode can control display luminance in accordance with the amount of external light in use of the tablet terminal that is measured with an optical sensor incorporated in the tablet terminal. The tablet terminal may include another detection device such as a gyro sensor or an acceleration sensor in addition to the optical sensor.

Note that FIG. 5A shows an example in which the display portion 9631a and the display portion 9631b have the same display area; however, without limitation thereon, one of the display portions may be different from the other display portion in size and display quality. For example, higher definition images may be displayed on one of the display portions 9631a and 9631b.

The tablet terminal is closed in FIG. 5B. The tablet terminal includes the housing 9630, a solar cell 9633, a charge and discharge control circuit 9634, a battery 9635, and a DCDC converter 9636.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

The tablet terminal illustrated in FIGS. 5A and 5B can also have a function of displaying various kinds of data, such as a calendar, a date, or the time, on the display portion as a still image, a moving image, and a text image, a function of displaying, a touch-input function of operating or editing data displayed on the display portion by touch input, a function of controlling processing by various kinds of software (programs), and the like.

The solar cell 9633 provided on a surface of the tablet terminal can supply power to the touch panel, the display portion, a video signal processing portion, or the like. Note that a structure in which the solar cell 9633 is provided is preferable because the battery 9635 which supplies electric power to one or both of the display portion 9631a and the display portion 9631b can be charged. The use of a lithium ion battery as the battery 9635 is advantageous in downsizing or the like.

Figure 5C:
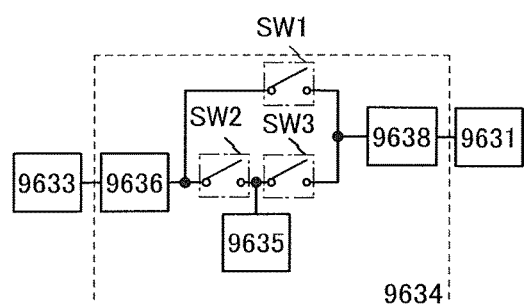

The structure and the operation of the charge and discharge control circuit 9634 illustrated in FIG. 5B are described with reference to a block diagram in FIG. 5C. The solar cell 9633, the battery 9635, the DCDC converter 9636, a converter 9638, switches SW1 to SW3, and the display portion 9631 are illustrated in FIG. 5C, and the battery 9635, the DCDC converter 9636, the converter 9638, and the switches SW1 to SW3 correspond to those in the charge and discharge control circuit 9634 illustrated in FIG. 5B.

An example of the operation in the case where power is generated by the solar cell 9633 using external light is described. The voltage of power generated by the solar cell 9633 is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9638 so as to be a voltage needed for the display portion 9631. In addition, when display on the display portion 9631 is not performed, the switch SW1 is turned off and the switch SW2 is turned on so that the battery 9635 is charged.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

As described above, the light-emitting elements included in the light-emitting device of the aforementioned electronic appliances are the light-emitting elements described in Embodiment 1 and have high emission efficiency, low driving voltage, and a long lifetime. Hence, electronic appliances with reduced power consumption, low driving voltage, and high reliability can be manufactured. It is needless to say that one embodiment of the present invention is not particularly limited to the electronic appliances illustrated in FIGS. 5A to 5C as long as the display portion described in the above embodiment is included.

As described above, the electronic appliances can be obtained by application of the light-emitting device of one embodiment of the present invention. The light-emitting device has a significantly wide application range, and can be applied to electronic appliances in a variety of fields.

Note that the structure described in this embodiment can be combined as appropriate with any of the structures described in the other embodiments and the examples.

[Embodiment 4]

In this embodiment, examples of lighting devices including a light-emitting device including the light-emitting elements described in Embodiment 1 will be described with reference to FIG. 6.

Figure 6:
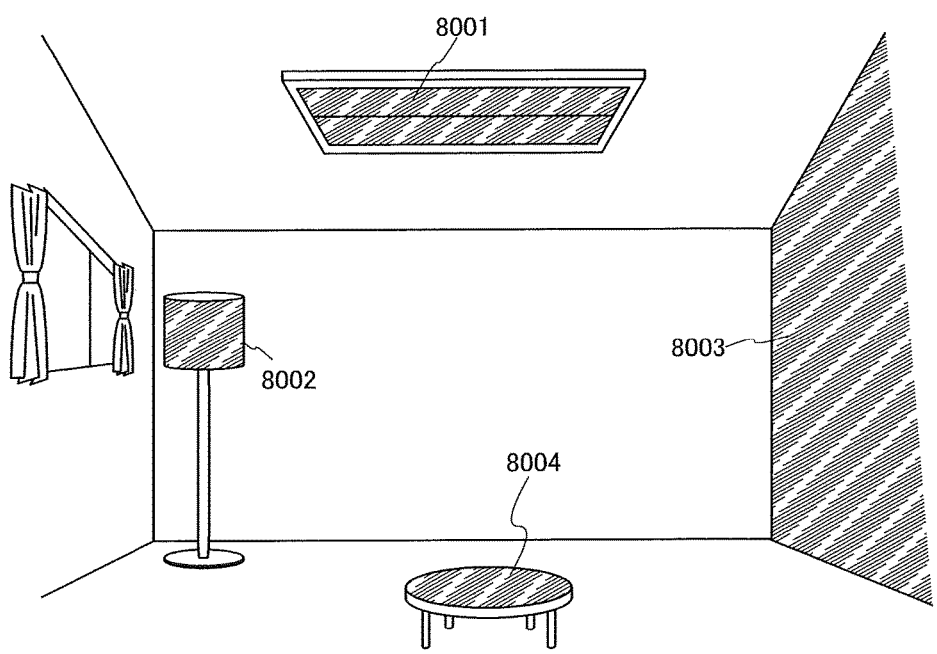
FIG. 6 illustrates lighting devices.

FIG. 6 illustrates an example in which the light-emitting device is used as an indoor lighting device 8001. Note that since the area of the light-emitting device can be increased, a lighting device having a large area can also be formed. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Thus, the lighting device can be elaborately designed in a variety of ways. In addition, a wall of the room may be provided with a large-sized lighting device 8003.

When the light-emitting device is used for a surface of a table, a lighting device 8004 which has a function as a table can be obtained. When the light-emitting device is used as part of other furniture, a lighting device which has a function as the furniture can be obtained.

In this manner, a variety of lighting devices in which the light-emitting device is used can be obtained. Note that the lighting device described in this embodiment includes the light-emitting device in which the light-emitting elements described in Embodiment 1 are arranged in a matrix. The light-emitting element included in the light-emitting device can have high emission efficiency. In addition, the light-emitting element can be driven at low voltage. Furthermore, the light-emitting elements can have a long lifetime. Accordingly, the lighting device in which the light-emitting device including the light-emitting elements is used can have reduced power consumption. In addition, the light-emitting device can have low drive voltage. Furthermore, the lighting device can be a lighting device having high reliability. Note that such lighting devices are also embodiments of the present invention.

Note that the structure described in this embodiment can be combined as appropriate with any of the structures described in the other embodiments and the examples.

[Embodiment 5]

In this embodiment, a light-emitting device fabricated using the light-emitting element of one embodiment of the present invention will be described with reference to FIGS. 13A and 13B.

Figure 13A:
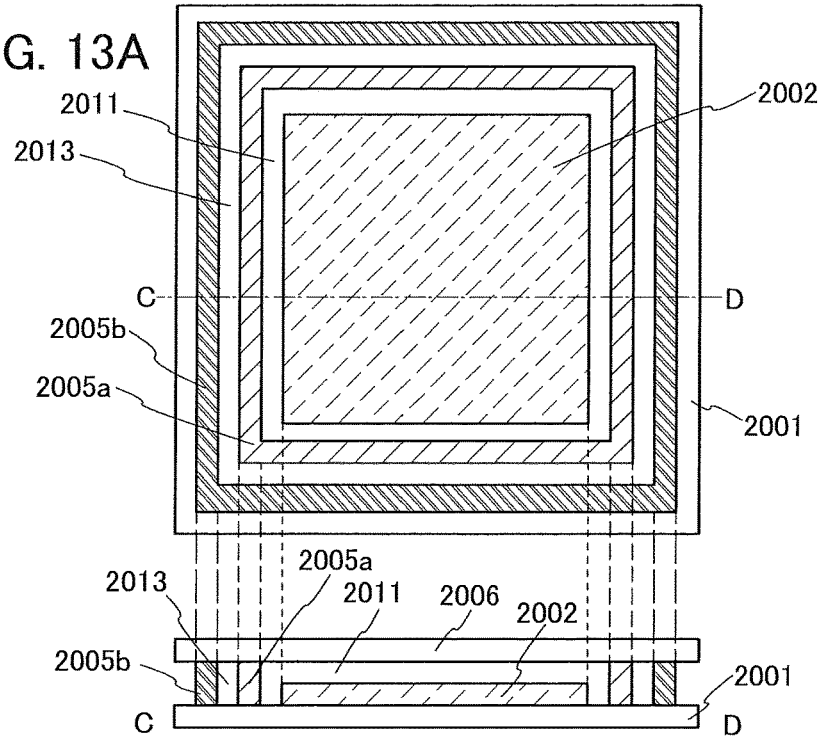
FIGS. 13A and 13B each illustrate a light-emitting device of one embodiment of the present invention.

In FIG. 13A, a plan view of a light-emitting device described in this embodiment and a cross-sectional view taken along the dashed-dotted line C-D in the plan view are illustrated.

The light-emitting device illustrated in FIG. 13A includes a light-emitting portion 2002 including an inverted-structure tandem light-emitting element over a first substrate 2001. The light-emitting device has a structure in which a first sealant 2005a is provided so as to surround the light-emitting portion 2002 and a second sealant 2005b is provided so as to surround the first sealant 2005a (i.e., a double sealing structure).

Thus, the light-emitting portion 2002 is positioned in a space surrounded by the first substrate 2001, a second substrate 2006, and the first sealant 2005a. The light-emitting portion 2002 includes the light-emitting element described in Embodiment 1.

Note that in this specification, the first sealant 2005a and the second sealant 2005b are not necessarily in contact with the first substrate 2001 and the second substrate 2006. For example, the first sealant 2005a may be in contact with an insulating film or a conductive film formed over the first substrate 2001.

In the above structure, the first sealant 2005a is a resin layer containing a desiccant and the second sealant 2005b is a glass layer, whereby an effect of suppressing entry of impurities such as moisture and oxygen from the outside (hereinafter, referred to as a sealing property) can be increased.

The first sealant 2005a is the resin layer as described above, whereby the glass layer that is the second sealant 2005b can be prevented from having breaking or cracking (hereinafter, collectively referred to as a crack). Furthermore, in the case where the sealing property of the second sealant 2005b is not sufficient, even when impurities such as moisture and oxygen enter a first space 2013, entry of the impurities into a second space 2011 can be suppressed because of a high sealing property of the first sealant 2005a. Thus, deterioration of an organic compound, a metal material, and the like contained in the light-emitting element due to entry of impurities can be suppressed.

Figure 13B:
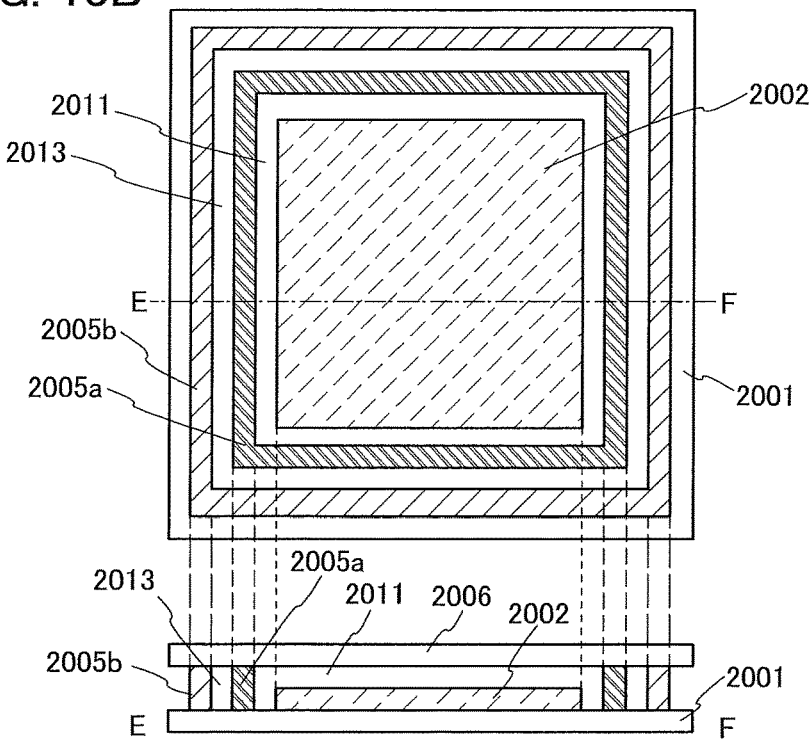

In addition, the structure illustrated in FIG. 13B can be employed: the first sealant 2005a is a glass layer and the second sealant 2005b is a resin layer containing a desiccant.

In the light-emitting device described in this embodiment, distortion due to external force or the like increases toward the outer portion of the light-emitting device. In view of this, the first sealant 2005a which has relatively small distortion due to external force or the like is a glass layer and the second sealant 2005b is a resin layer which has excellent impact resistance and excellent heat resistance and is hardly broken by deformation due to external force or the like, whereby entry of moisture and oxygen into the first space 2013 can be suppressed.

In addition to the above structure, a material serving as a desiccant may be contained in each of the first space 2013 and the second space 2011.

In the case where the first sealant 2005a or the second sealant 2005b is a glass layer, for example, a glass frit or a glass ribbon can be used. Note that at least a glass material is contained in a glass frit or a glass ribbon.

The glass frit contains a glass material as a frit material. The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one or more kinds of transition metals to absorb infrared light.

Furthermore, in the case where a glass layer is formed using any of the above glass frits, for example, a frit paste is applied to a substrate and is subjected to heat treatment, laser light irradiation, or the like. The frit paste contains the frit material and a resin (also referred to as a binder) diluted with an organic solvent. The frit paste can be formed using a known material and a known composition. An absorber which absorbs light having a wavelength of laser light may be added to the frit material. For example, an Nd:YAG laser or a semiconductor laser is preferably used as a laser. The shape of laser light may be circular or quadrangular.

Note that the thermal expansion coefficient of the glass layer to be formed is preferably close to that of the substrate. The closer the thermal expansion coefficients are, the more generation of a crack in the glass layer or the substrate due to thermal stress can be suppressed.

Although any of known materials, for example, photocurable resins such as an ultraviolet curable resin and thermosetting resins can be used in the case where the first sealant 2005a or the second sealant 2005b is a resin layer, it is particularly preferable to use a material which does not transmit moisture or oxygen. In particular, a photocurable resin is preferably used. The light-emitting element contains a material having low heat resistance in some cases. A photocurable resin, which is cured by light irradiation, is preferably used, in which case change in film quality and deterioration of an organic compound itself caused by heating of the light-emitting element can be suppressed. Furthermore, any of the organic compounds that can be used for the light-emitting element of one embodiment of the present invention may be used.

As the desiccant contained in the resin layer, the first space 2013, or the second space 2011, a known material can be used. As the desiccant, a substance which adsorbs moisture by chemical adsorption or a substance which adsorbs moisture by physical adsorption can be used. Examples thereof are alkali metal oxides, alkaline earth metal oxide (e.g., calcium oxide and barium oxide), sulfate, metal halides, perchlorate, zeolite, silica gel, and the like.

One or both of the first space 2013 and the second space 2011 may have, for example, an inert gas such as a rare gas or a nitrogen gas or may contain an organic resin. Note that these spaces are each in an atmospheric pressure state or a reduced pressure state.

As described above, the light-emitting device described in this embodiment has a double sealing structure, in which one of the first sealant 2005a and the second sealant 2005b is the glass layer having excellent productivity and an excellent sealing property, and the other is the resin layer which has excellent impact resistance and excellent heat resistance and is hardly broken by deformation due to external force or the like, and can contain the desiccant inside, so that a sealing property of suppressing entry of impurities such as moisture and oxygen from the outside can be improved.

Thus, the use of the structure described in this embodiment can provide a light-emitting device in which deterioration of a light-emitting element due to impurities such as moisture and oxygen is suppressed.

Note that the structure described in this embodiment can be combined as appropriate with any of the structures described in the other embodiments and the examples.

[Embodiment 6]

In this embodiment, a light-emitting device fabricated using the light-emitting element of one embodiment of the present invention will be described with reference to FIG. 14.

A light-emitting device 3100 illustrated in FIG. 14 includes light-emitting elements 3120a, 3120b, and 3120c. The light-emitting elements 3120a, 3120b, and 3120c are light-emitting elements in which a plurality of light-emitting layers are provided between lower electrodes 3103a, 3103b, and 3103c and an upper electrode 3119.

The light-emitting device 3100 includes the island-shaped lower electrodes 3103a, 3103b, and 3103c over a substrate 3101. The lower electrodes 3103a, 3103b, and 3103c can function as cathodes of the light-emitting elements. Note that reflective electrodes may be provided under the lower electrodes 3103a, 3103b, and 3103c. Transparent conductive films 3105a and 3105b may be provided over the lower electrodes 3103a and 3103b. The transparent conductive films 3105a and 3105b preferably have different thicknesses depending on the emission color of the element. Although not illustrated, a transparent conductive film may also be provided over the lower electrode 3103c. Alternatively, the lower electrodes 3103a, 3103b, and 3103c themselves may be formed of a transparent conductive film. The transparent conductive film may be an oxide transparent conductive film.

Furthermore, the light-emitting device 3100 includes partitions 3107a, 3107b, 3107c, and 3107d. Specifically, the partition 3107a covers one edge portion of the lower electrode 3103a and one edge portion of the transparent conductive film 3105a. The partition 3107b covers the other edge portion of the lower electrode 3103a and the other edge portion of the transparent conductive film 3105a and also covers one edge portion of the lower electrode 3103b and one edge portion of the transparent conductive film 3105b. The partition 3107c covers the other edge portion of the lower electrode 3103b and the other edge portion of the transparent conductive film 3105b and also covers one edge portion of the lower electrode 3103c. The partition 3107d covers the other edge portion of the lower electrode 3103c.

Furthermore, the light-emitting device 3100 includes a layer 3110 over the lower electrodes 3103a, 3103b, and 3103c and the partitions 3107a, 3107b, 3107c, and 3107d. The layer 3110 has a function of suppressing movement of an alkali metal or an alkaline earth metal included in an electron-injection layer 3112.

The light-emitting device 3100 includes the electron-injection layer 3112 over the layer 3110. The light-emitting device 3100 further includes an electron-transport layer 3113 over the electron-injection layer 3112.

The light-emitting device 3100 includes a light-emitting layer 3114 over the electron-transport layer 3113. The light-emitting device 3100 further includes a hole-transport layer 3116 over the light-emitting layer 3114. The light-emitting device 3100 further includes a hole-injection layer 3118 over the hole-transport layer 3116.

The light-emitting device 3100 includes the upper electrode 3119 over the hole-injection layer 3118. The upper electrode 3119 can function as anodes of the light-emitting elements.

Note that the structure described in this embodiment can be combined as appropriate with any of the structures described in the other embodiments and the examples.

[Embodiment 7]

In this embodiment, a lighting device fabricated using the light-emitting element of one embodiment of the present invention will be described with reference to FIGS. 15A to 15E.

FIGS. 15A to 15E are a plan view and cross-sectional views of lighting devices. FIGS. 15A to 15C illustrate bottom-emission lighting devices in which light is extracted from the substrate side. FIG. 15B is a cross-sectional view taken along the dashed-dotted line G-H in FIG. 15A.

A lighting device 4000 illustrated in FIGS. 15A and 15B includes an inverted-structure light-emitting element 4007 over a substrate 4005. In addition, the lighting device 4000 includes a substrate 4003 with unevenness on the outside of the substrate 4005. The inverted-structure light-emitting element 4007 includes a lower electrode 4013, an EL layer 4014, and an upper electrode 4015. Note that the EL layer 4014 may include two or more EL layers and an intermediate layer between every two EL layers.

The lower electrode 4013 is electrically connected to an electrode 4009, and the upper electrode 4015 is electrically connected to an electrode 4011. In addition, an auxiliary wiring 4017 electrically connected to the lower electrode 4013 may be provided.

The substrate 4005 and a sealing substrate 4019 are bonded to each other by a sealant 4021. A desiccant 4023 is preferably provided between the sealing substrate 4019 and the light-emitting element 4007.

The substrate 4003 has the unevenness illustrated in FIG. 15A, whereby the extraction efficiency of light emitted from the light-emitting element 4007 can be increased. Instead of the substrate 4003, a diffusion plate 4027 may be provided on the outside of a substrate 4025 as in a lighting device 4001 illustrated in FIG. 15C.

FIGS. 15D and 15E illustrate top-emission lighting devices in which light is extracted from the side opposite to the substrate.

A lighting device 4100 illustrated in FIG. 15D includes an inverted-structure light-emitting element 4107 over a substrate 4125. The light-emitting element 4107 includes a lower electrode 4113, an EL layer 4114, and an upper electrode 4115. Note that the EL layer 4114 may include two or more EL layers and an intermediate layer between every two EL layers.

The lower electrode 4113 is electrically connected to an electrode 4109, and the upper electrode 4115 is electrically connected to an electrode 4111. An auxiliary wiring 4117 electrically connected to the upper electrode 4115 may be provided. An insulating layer 4131 may be provided under the auxiliary wiring 4117.

The substrate 4125 and a sealing substrate 4103 with unevenness are bonded to each other by a sealant 4121. A planarization film 4105 and a barrier film 4129 may be provided between the sealing substrate 4103 and the light-emitting element 4107.

The sealing substrate 4103 has the unevenness illustrated in FIG. 15D, whereby the extraction efficiency of light emitted from the light-emitting element 4107 can be increased. Instead of the sealing substrate 4103, a diffusion plate 4127 may be provided over the light-emitting element 4107 as in a lighting device 4101 illustrated in FIG. 15E.

Note that the structure described in this embodiment can be combined as appropriate with any of the structures described in the other embodiments and the examples.

[Embodiment 8]

In this embodiment, a touch sensor and a module that can be combined with a light-emitting device of one embodiment of the present invention will be described with reference to FIGS. 16A and 16B, FIG. 17, FIG. 18, and FIG. 19.

Figure 16A:
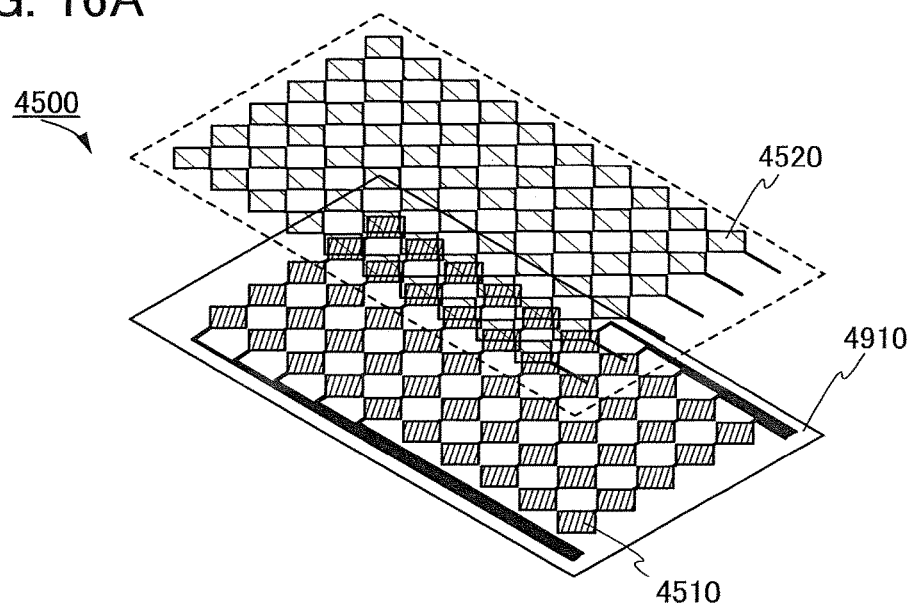
FIGS. 16A and 16B illustrate a touch sensor.
Figure 16B:
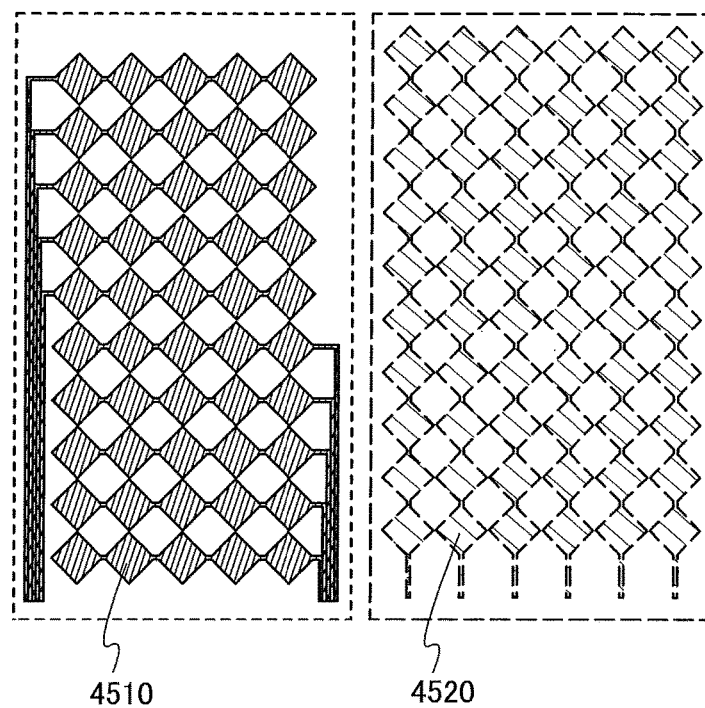

FIG. 16A is an exploded perspective view of a structural example of a touch sensor 4500. FIG. 16B is a plan view of a structural example of an electrode of the touch sensor 4500.

The touch sensor 4500 illustrated in FIGS. 16A and 16B includes, over a substrate 4910, a plurality of conductive layers 4510 arranged in the X-axis direction and a plurality of conductive layers 4520 arranged in the Y-axis direction intersecting with the X-axis direction. In FIGS. 16A and 16B illustrating the touch sensor 4500, a plane over which the plurality of conductive layers 4510 are formed and a plane over which the plurality of conductive layers 4520 are formed are separately illustrated.

Figure 17:
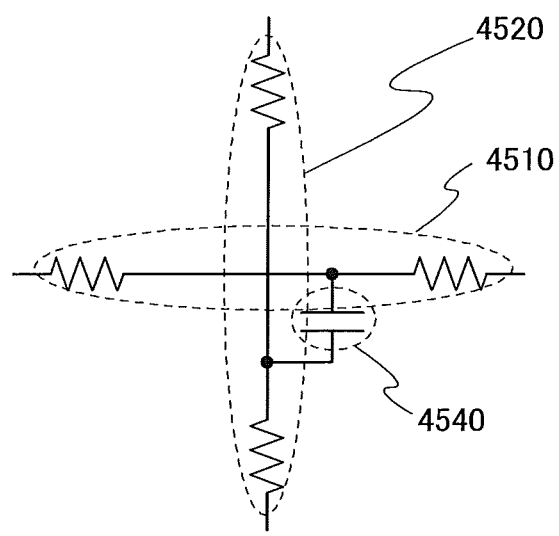
FIG. 17 is a circuit diagram illustrating a touch sensor.

FIG. 17 is an equivalent circuit diagram of an intersection portion of the conductive layer 4510 and the conductive layer 4520. As illustrated in FIG. 17, a capacitor 4540 is formed at the intersection portion of the conductive layer 4510 and the conductive layer 4520.

The plurality of conductive layers 4510 and the plurality of conductive layers 4520 have structures in each of which a plurality of quadrangular conductive films are connected to each other. The plurality of conductive layers 4510 and the plurality of conductive layers 4520 are provided so that the quadrangular conductive films of the plurality of conductive layers 4510 do not overlap with the quadrangular conductive films of the plurality of conductive layers 4520. At the intersection portion of the conductive layer 4510 and the conductive layer 4520, an insulating film is provided between the conductive layer 4510 and the conductive layer 4520 to prevent the conductive layers 4510 and 4520 from being in contact with each other.

Figure 18:
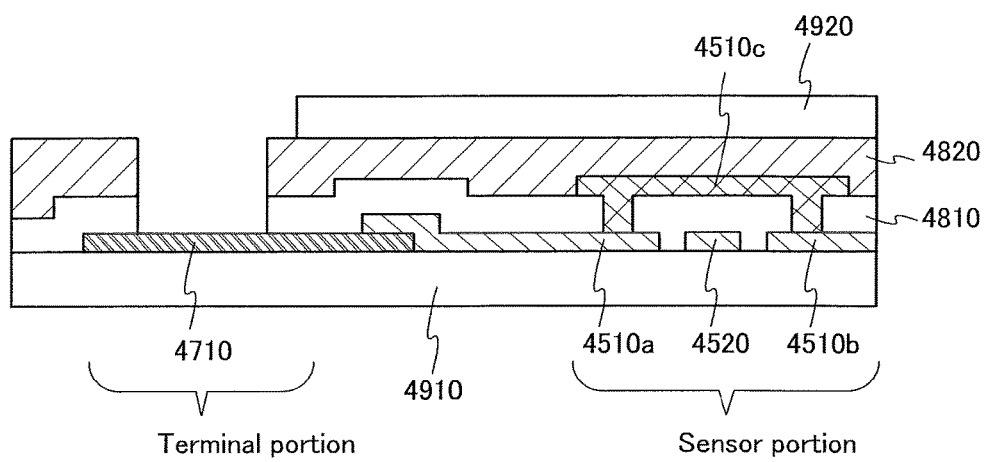
FIG. 18 is a cross-sectional view illustrating a touch sensor.

FIG. 18 is a cross-sectional view illustrating an example of a connection structure between conductive layers 4510a, 4510b, and 4510c and the conductive layer 4520 of the touch sensor 4500 in FIGS. 16A and 16B. FIG. 18 illustrates, as an example, a cross-sectional view of a portion where the conductive layers 4510 (the conductive layers 4510a, 4510b, and 4510c) intersects with the conductive layer 4520.

As illustrated in FIG. 18, the conductive layers 4510 include the conductive layer 4510a and the conductive layer 4510b in the first layer and the conductive layer 4510c in the second layer over an insulating layer 4810. The conductive layer 4510a and the conductive layer 4510b are connected by the conductive layer 4510c. The conductive layer 4520 is fruited using the conductive layer in the first layer. An insulating layer 4820 is formed so as to cover the conductive layers 4510 and 4520 and part of a conductive layer 4710. As the insulating layers 4810 and 4820, silicon oxynitride films are formed, for example. A base film formed using an insulating film may be provided between the substrate 4910 and the conductive layers 4710, 4510a, 4510b, and 4520. As the base film, for example, a silicon oxynitride film can be formed.

The conductive layers 4510a, 4510b, and 4510c and the conductive layer 4520 are formed using a conductive material that transmits visible light, such as indium tin oxide containing silicon oxide, indium tin oxide, zinc oxide, indium zinc oxide, or zinc oxide to which gallium is added.

The conductive layer 4510a is connected to the conductive layer 4710. A terminal for connection to an FPC is formed using the conductive layer 4710. The conductive layer 4520 is connected to the conductive layer 4710 like the conductive layer 4510a. The conductive layer 4710 can be formed of, for example, a tungsten film.

The insulating layer 4820 is formed so as to cover the conductive layers 4510 and 4520 and the conductive layer 4710. An opening is formed in the insulating layers 4810 and 4820 over the conductive layer 4710 so that the conductive layer 4710 is electrically connected to the FPC. A substrate 4920 is attached to the insulating layer 4820 using an adhesive, an adhesive film, or the like. The substrate 4910 side is bonded to a color filter substrate of a display panel with an adhesive or an adhesive film, so that a touch panel is completed.

Next, a module that can be formed using a light-emitting device of one embodiment of the present invention is described with reference to FIG. 19.

Figure 19:
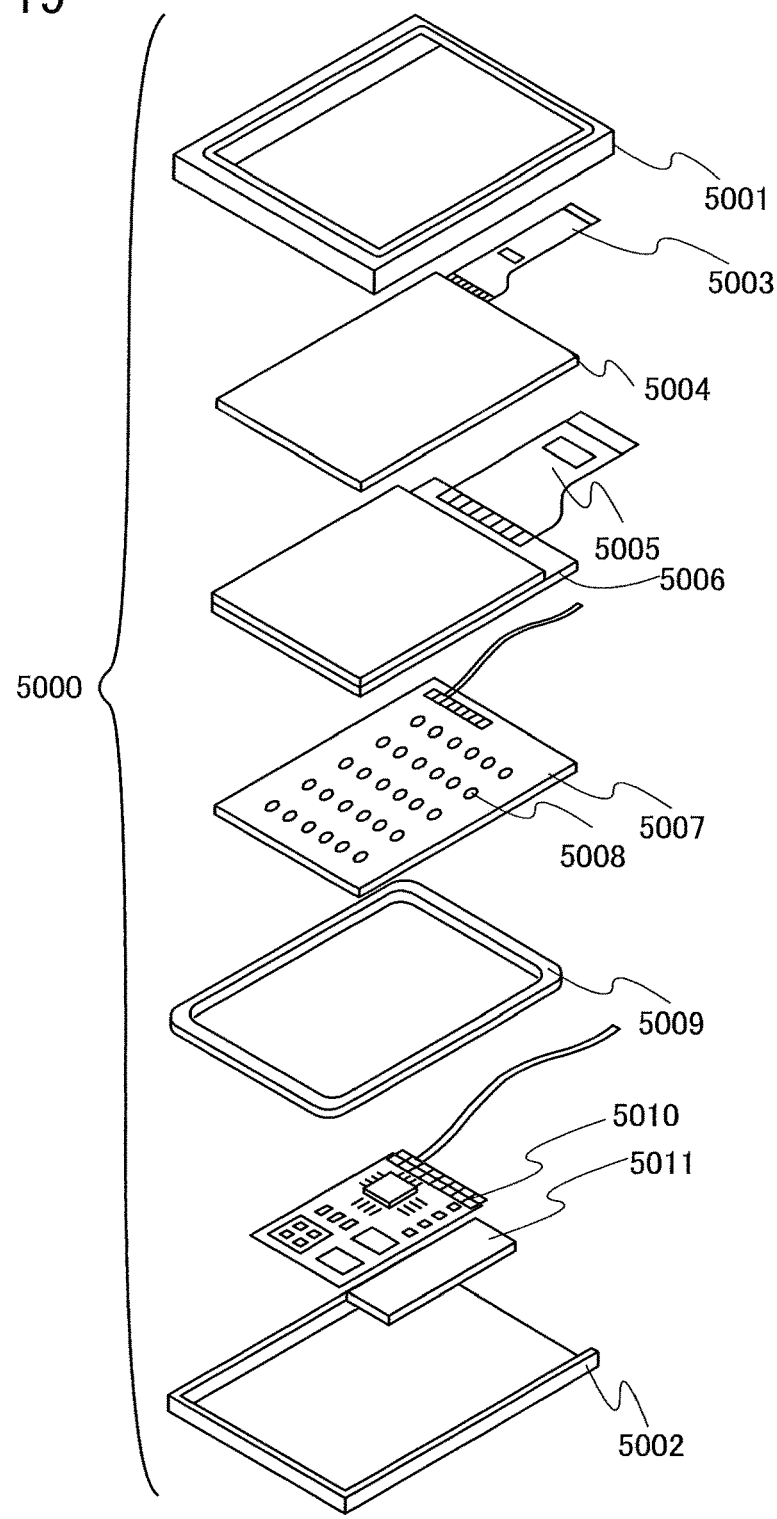
FIG. 19 illustrates a module using a light-emitting device of one embodiment of the present invention.

In a module 5000 in FIG. 19, a touch panel 5004 connected to an FPC 5003, a display panel 5006 connected to an FPC 5005, a backlight unit 5007, a frame 5009, a printed board 5010, and a battery 5011 are provided between an upper cover 5001 and a lower cover 5002. As the backlight unit 5007, the lighting device described in Embodiment 7 can be used, for example.

The shapes and sizes of the upper cover 5001 and the lower cover 5002 can be changed as appropriate in accordance with the sizes of the touch panel 5004 and the display panel 5006.

The touch panel 5004 can be a resistive touch panel or a capacitive touch panel and may be formed so as to overlap with the display panel 5006. A counter substrate (sealing substrate) of the display panel 5006 can have a touch panel function. A photosensor may be provided in each pixel of the display panel 5006 so that the touch panel 5004 can function as an optical touch panel.

The backlight unit 5007 includes a light source 5008. Note that although a structure in which the light sources 5008 are placed over the backlight unit 5007 is illustrated in FIG. 19, one embodiment of the present invention is not limited to this structure. For example, a structure in which the light source 5008 is placed at an end portion of the backlight unit 5007 and a light diffusion plate is used may be employed.

The frame 5009 protects the display panel 5006 and functions as an electromagnetic shield for blocking electromagnetic waves generated by the operation of the printed board 5010. The frame 5009 may function as a radiator plate.

The printed board 5010 is provided with a power supply circuit and a signal processing circuit for outputting a video signal and a clock signal. As a power source for supplying power to the power supply circuit, an external commercial power source or a power source using the battery 5011 provided separately may be used. The battery 5011 can be omitted in the case of using a commercial power source.

The module 5000 can be additionally provided with a member such as a polarizing plate, a retardation plate, or a prism sheet.

Note that the structures and the like described in this embodiment can be combined as appropriate with any of the structures described in the other embodiments and the examples.

[Embodiment 9]

In this embodiment, a structure of the light-emitting element of one embodiment of the present invention will be described with reference to FIGS. 20A and 20B.

Figure 20A:
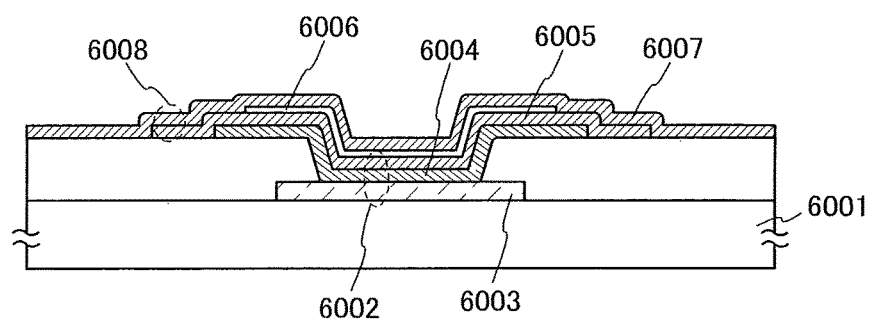
FIGS. 20A and 20B each illustrate a light-emitting element of one embodiment of the present invention.

A light-emitting element 6002 illustrated in FIG. 20A is formed over a substrate 6001. The light-emitting element 6002 includes a first electrode 6003, an EL layer 6004, and a second electrode 6005. Note that the EL layer may include two or more EL layers and an intermediate layer between every two the EL layers. In the light-emitting element illustrated in FIG. 20A, a buffer layer 6006 is formed over the second electrode 6005, and a third electrode 6007 is formed over the buffer layer 6006. The buffer layer 6006 can prevent a decrease in light-extraction efficiency due to surface plasmon on a surface of the second electrode 6005.

Note that the second electrode 6005 and the third electrode 6007 are electrically connected to each other in a contact portion 6008. The position of the contact portion 6008 is not limited to the position in the drawing, and may be formed in a light-emitting region The first electrode 6003 functions as a cathode and the second electrode 6005 functions as an anode. Light can be extracted as long as at least one of the electrodes has a light-transmitting property, but the both may be formed with a light-transmitting material. In the case where the first electrode 6003 has a function of transmitting light from the EL layer 6004, an oxide transparent conductive film such as ITO can be used. In the case where the first electrode 6003 blocks light from the EL layer 6004, a conductive film formed by stacking a plurality of layers (e.g., ITO and silver) can be used.

In a structure in which light from the EL layer 6004 is extracted from the first electrode 6003 side, the thickness of the second electrode 6005 is preferably smaller than the thickness of the third electrode 6007. In a structure in which the light is extracted from the opposite side, the thickness of the second electrode 6005 is preferably larger than the thickness of the third electrode 6007. However, the thickness is not limited thereto.

For the buffer layer 6006, an organic film (e.g., Alq), an inorganic insulating material (e.g., a silicon nitride film), or the like can be used.

Figure 20B:
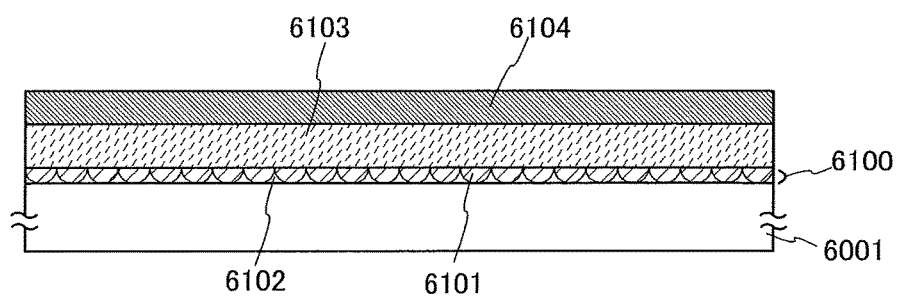

The light-extraction efficiency may be improved by employing a structure illustrated in FIG. 20B as a structure including the light-emitting element of one embodiment of the present invention.

In the structure illustrated in FIG. 20B, a light scattering layer 6100 including a light scatterer 6101 and an air layer 6102 is formed in contact with the substrate 6001; a high refractive index layer 6103 formed with an organic resin is formed in contact with the light scattering layer 6100; and an element layer 6104 including a light-emitting element and the like is formed in contact with the high refractive index layer 6103.

For the light scatterer 6101, particles such as ceramic particles can be used. For the high refractive index layer 6103, a high refractive index (e.g., refractive index greater than or equal to 1.7 and less than or equal to 1.8) material such as polyethylene naphthalate (PEN) can be used.

The element layer 6104 includes the inverted-structure light-emitting element described in Embodiment 1.

EXAMPLE 1

An inverted-structure light-emitting element according to one embodiment of the present invention will be described.

Structural formulae and abbreviations of materials used in this example are shown below. The element structure is similar to that illustrated in FIG. 1.

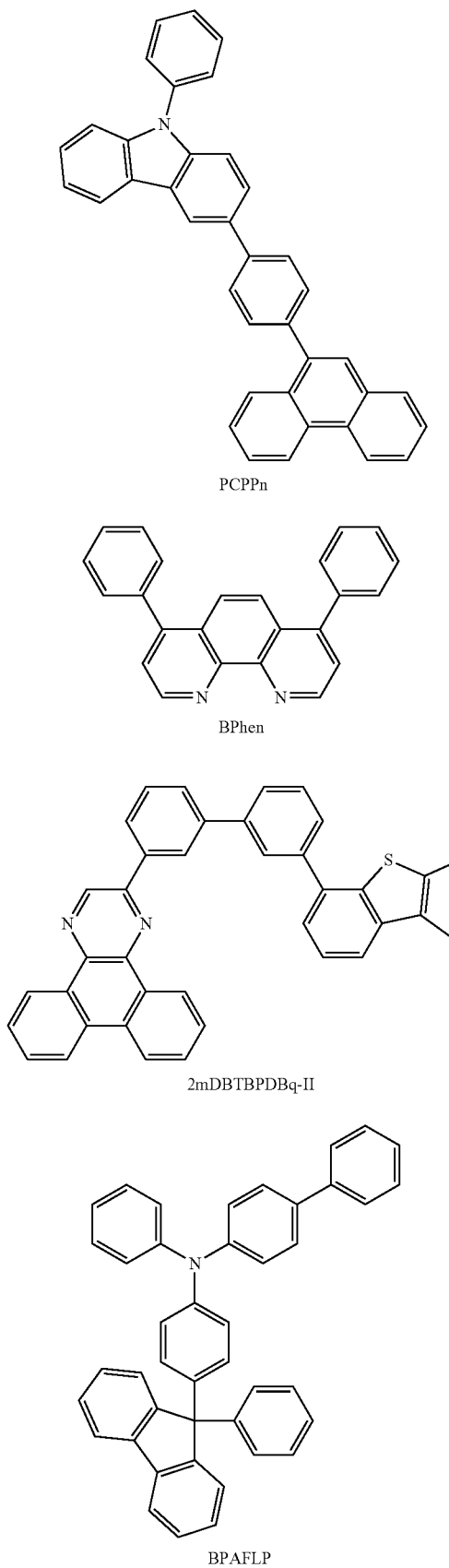

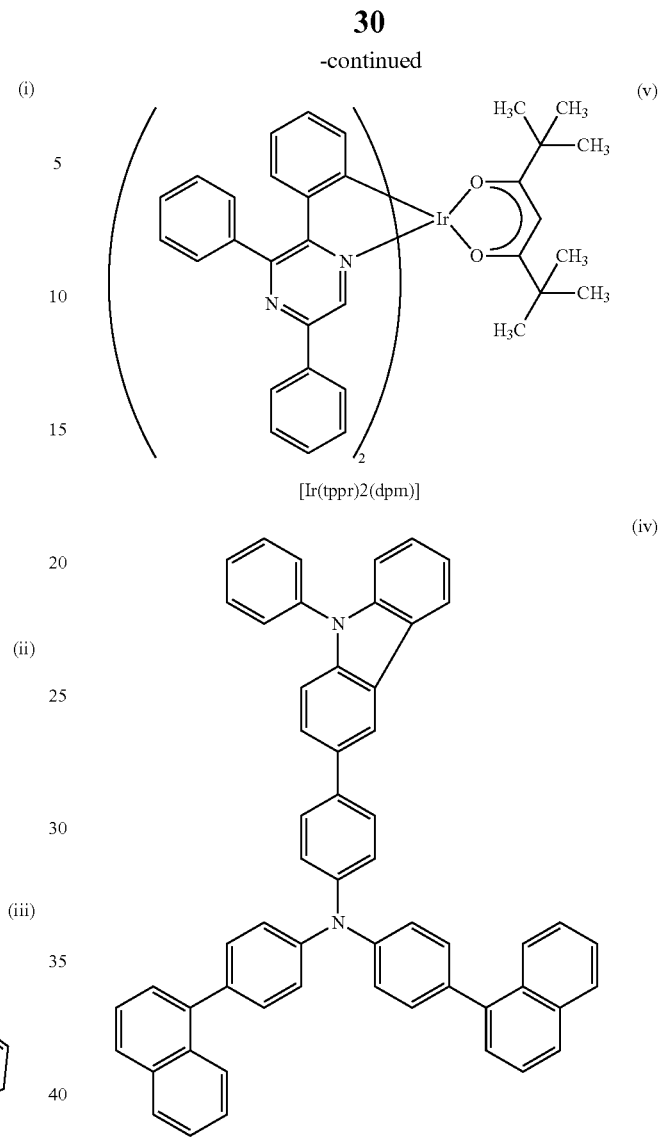

<<Fabrication of Light-Emitting Element 1>>

First, a glass substrate was prepared as the substrate 100.

An indium tin oxide film containing silicon oxide (ITSO) was formed over the glass substrate to a thickness of 110 nm by a sputtering method, thereby forming the cathode 101. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV ozone treatment was performed for 370 seconds.

Next, the substrate was fixed to a holder provided in the vacuum evaporation apparatus so that the surface of the substrate over which the ITSO film was formed faced downward. After that, the pressure inside the vacuum evaporation apparatus was reduced to approximately $10^{-4}$ Pa, vacuum baking at 170° C. for 30 minutes was performed in a heating chamber of the vacuum evaporation apparatus, and then the substrate was cooled down for approximately 30 minutes.

After the substrate was cooled, bathophenanthroline (abbreviation: BPhen) represented by the above structural formula (ii) was deposited by evaporation to a thickness of 5 nm. The formed BPhen film functions as the layer 102 which prevents contact of an alkali metal or an alkaline earth metal with the cathode and serves as a buffer.

Next, lithium oxide ($Li_2O$) was deposited by evaporation to a thickness of 0.15 nm, and then bathophenanthroline (abbreviation: BPhen) was deposited by evaporation to a thickness of 10 nm. Thus, the electron-injection layer 103 was formed.

When evaporation during the formation of the electron-injection layer 103 allows lithium oxide to reach the surface on which lithium oxide is formed, Li is diffused into the layer thereunder. However, the layer 102 suppresses entry of Li into the cathode 101. Contact of Li with the cathode increases driving voltage, reduces power efficiency, and shortens a lifetime in the case of an inverted-structure light-emitting element without the layer 102.

Next, 2-[3'-(dibenzothiophen-4-yl)biphenyl-3-yl]dibenzo[f,h]quinoxaline (abbreviation: 2mDBTBPDBq-II) represented by the above structural formula (iii) was deposited to a thickness of 20 nm, thereby forming the electron-transport layer 104.

Over the electron-transport layer 104, the light-emitting layer 105 was formed in such a manner that 2mDBTBP-DBq-II, 4,4'-di(1-naphthyl)-4"-(9-phenyl-9H-carbazol-3-yl)triphenylamine (abbreviation: PCBNBB) represented by the above structural formula (iv), and bis(2,3,5-triphenylpyrazinato)(dipivaloylmethanato)iridium(III) (abbreviation: [Ir(tppr)$_2$(dpm)]) represented by above structural formula (v) were co-evaporated to a thickness of 30 nm. The weight ratio was 0.8:0.2:0.06 (=2mDBTBPDBq-II:PCBNBB:[Ir(tppr)$_2$(dpm)]).

Over the light-emitting layer 105, 4-phenyl-4'-(9-phenyl-fluoren-9-yl)triphenylamine (abbreviation: BPAFLP) represented by the above structural formula (vi) was deposited to a thickness of 20 nm, thereby forming the hole-transport layer 106.

Over the hole-transport layer 106, 3-[4-(9-phenanthryl)-phenyl]-9-phenyl-9H-carbazole (abbreviation: PCPPn) represented by the above structural formula (i) and molybdenum oxide were co-evaporated to a thickness of 30 nm such that the weight ratio of PCPPn to molybdenum oxide was 1:0.5, thereby forming the hole-injection layer 107.

Next, aluminum was deposited to a thickness of 200 nm by evaporation over the hole-injection layer 107, thereby forming the anode 108.

The light-emitting element 1 was completed with the cathode 101, the layer 102, the electron-injection layer 103, the electron-transport layer 104, the light-emitting layer 105, the hole-transport layer 106, the hole-injection layer 107, and the anode 108. Note that in all the examples in this specification, evaporation was performed by a resistance-heating method.

<<Fabrication of Comparative Light-Emitting Element 1>>

A comparative light-emitting element 1 was formed in substantially the same manner as the light-emitting element 1 except for the layer 102. The electron-injection layer 103 was formed over the cathode 101 without formation of the layer 102.

The structure except for the layer 102 is the same as that of the light-emitting element 1, and repetition of the description thereof is omitted. Refer to the method of fabricating the light-emitting element 1.

As described above, the comparative light-emitting element 1 was completed. The difference between the comparative light-emitting element 1 and the light-emitting element 1 is whether the layer 102 that suppresses movement of an alkali metal or an alkaline earth metal is formed or not. The following Table 1 summarizes stacked-layer structures of the comparative light-emitting element 1 and the light-emitting element 1.

TABLE 1

| | Cathode 101 | Layer 102 | Electron-injection layer 103 | |
|---|---|---|---|---|
| Light-emitting element 1 | ITSO (110 nm) | BPhen (5 nm) | $Li_2O$ (0.15 nm) | BPhen (10 nm) |
| Comparative light-emitting element 1 | | | | |

| | Electron-transport layer 104 | Light-emitting layer 105 | Hole-transport layer 106 | Hole-injection layer 107 | Anode 108 |
|---|---|---|---|---|---|
| | 2mDBTBPDBq-II (20 nm) | *1 | BPAFLP (20 nm) | PCPPn:MoOx (1:0.5 30 nm) | Al (200 nm) |

*1 2mDBTBPDBq-II:CBNBB:[Ir(tppr)$_2$(dpm)] (0.8:0.2:0.06 30 nm)

<<Operation Characteristics of Light-Emitting Element 1 and Comparative Light-Emitting Element 1>>

In a glove box under a nitrogen atmosphere, the light-emitting element 1 and the comparative light-emitting element 1 obtained as described above were sealed so as not to be exposed to the air (a sealant was applied onto the periphery of each element, and heat treatment at 80° C. for 1 hour and UV treatment were performed). Then, the operation characteristics of the light-emitting element 1 and the comparative light-emitting element 1 were measured. Note that the measurements were carried out at room temperature (in an atmosphere kept at 25° C.).

Figure 7:
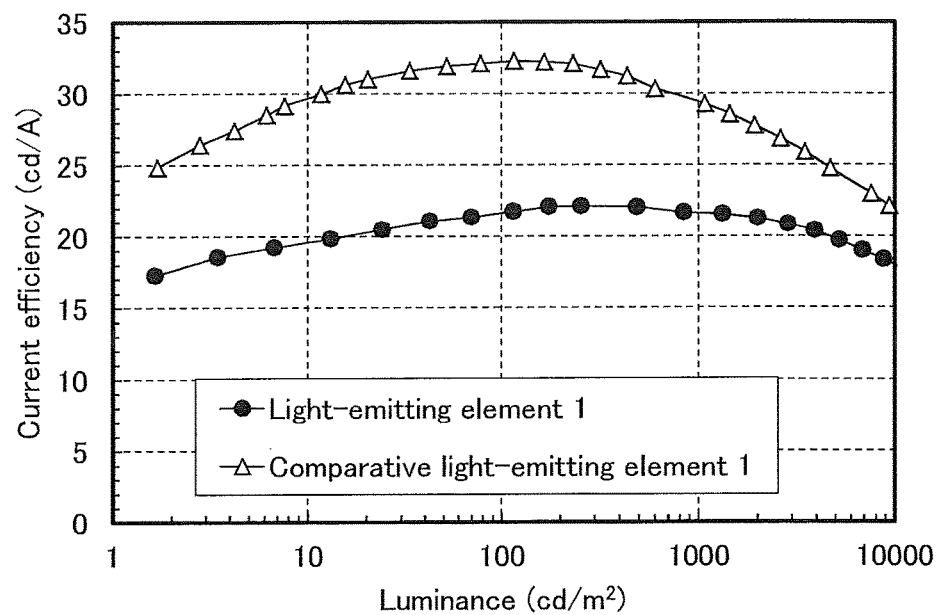
FIG. 7 shows luminance versus current efficiency characteristics of a light-emitting element 1 and a comparative light-emitting element 1.
Figure 8:
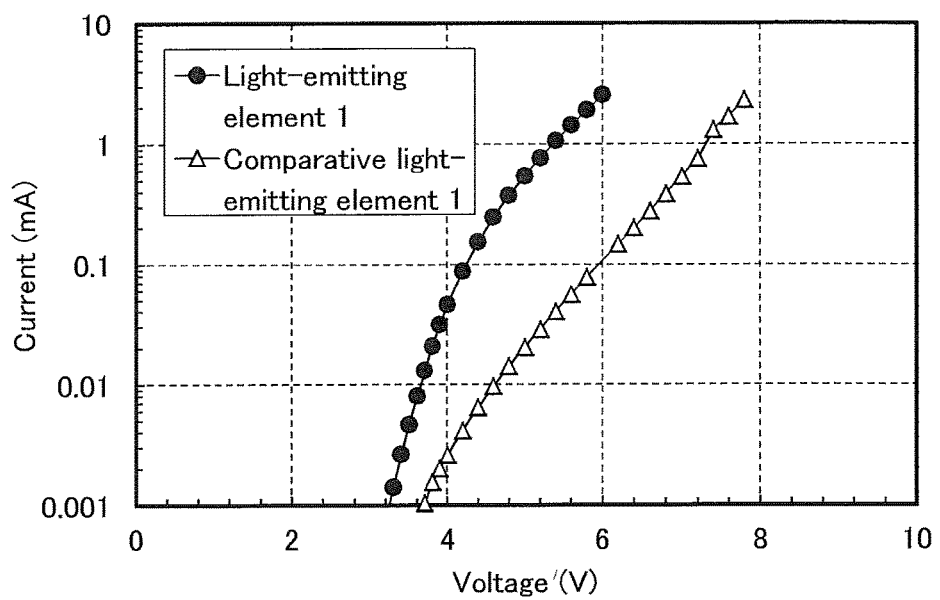
FIG. 8 shows voltage versus current characteristics of the light-emitting element 1 and the comparative light-emitting element 1.

FIG. 7 shows luminance versus current efficiency characteristics of the light-emitting element 1 and the comparative light-emitting element 1, and FIG. 8 shows voltage versus current characteristics thereof. In FIG. 7, the vertical axis represents current efficiency (cd/A), and the horizontal axis represents luminance (cd/m$^2$). In FIG. 8, the vertical axis represents current (mA), and the horizontal axis represents voltage (V).

Table 2 lists the values of the main characteristics. Note that the light-emitting element 1 and the comparative light-emitting element 1 emitted red light.

TABLE 2

|  | Voltage (V) | Current (mA) | Current density (mA/cm$^2$) | Chromaticity (x, y) | Luminance (cd/m$^2$) | Current efficiency (cd/A) | Power efficiency (lm/W) |
| --- | --- | --- | --- | --- | --- | --- | --- |
| Light-emitting element 1 | 4.4 | 0.15 | 3.86 | (0.67, 0.33) | 837 | 21.7 | 15.5 |
| Comparative light-emitting element 1 | 6.2 | 0.15 | 3.69 | (0.67, 0.33) | 1081 | 29.3 | 14.8 |

The comparative light-emitting element 1 has higher driving voltage and lower power efficiency than the light-emitting element 1. This is because the comparative light-emitting element 1 does not include layer 102 and the electron-injection layer 103 containing lithium that is an alkali metal is in direct contact with the cathode 101, which causes a large electron injection barrier between the cathode and the electron-injection layer.

<<Reliability Tests of Light-Emitting Element 1 and Comparative Light-Emitting Element 1>>

Figure 9:
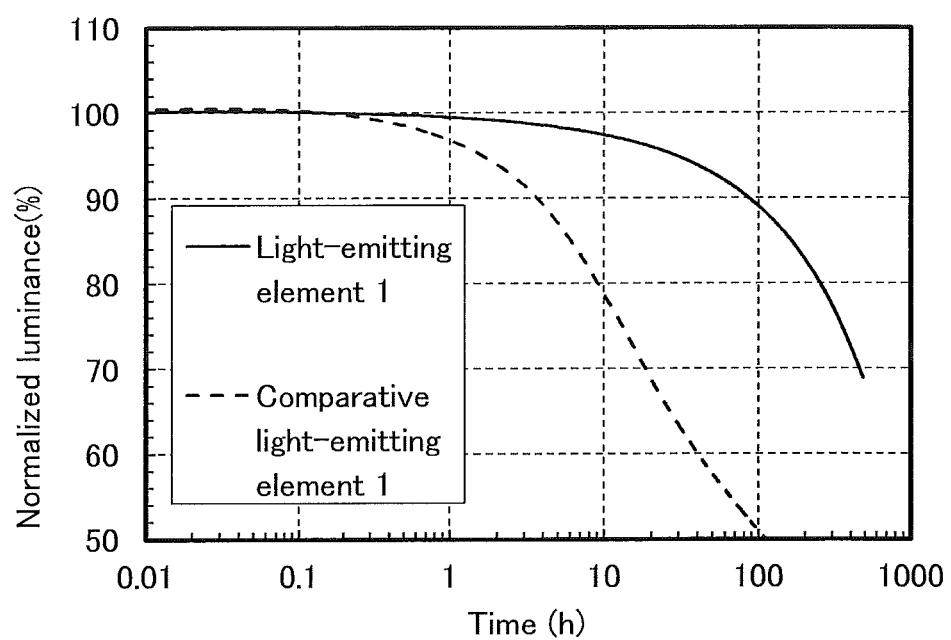
FIG. 9 shows time dependences of normalized luminance of the light-emitting element 1 and the comparative light-emitting element 1.

Furthermore, the light-emitting element 1 and the comparative light-emitting element 1 were subjected to reliability tests. FIG. 9 shows time dependence of normalized luminance at the time of constant current drive. In FIG. 9, the vertical axis represents normalized luminance (%), and the horizontal axis represents time (h). In the reliability tests, the luminance of the light emitting element 1 after 480 hours from the start of testing kept approximately 69% of the initial luminance, whereas that of the comparative light emitting element 1 decreases to 50% or less of the initial luminance before reaching 110 hours from the start of testing and therefore the reliability test was stopped in the middle.

A luminance reduction with driving time is more significant and a voltage change at the time of constant current drive is much greater in the comparative light-emitting element 1 than those in the light-emitting element 1. This shows that the light-emitting element 1 has higher reliability than the comparative light-emitting element 1. The inverted-structure light-emitting element which includes the layer 102 can be a highly reliable light-emitting element enjoying the advantage of the inverted structure owing to the function of the layer 102.

EXAMPLE 2

An inverted-structure light-emitting element of one embodiment of the present invention will be described.

Because the materials used in this example are the same kind as those used in Example 1, the chemical structural formulae and abbreviation thereof are omitted here. The element structure is the same as that illustrated in FIG. 1.

<<Fabrication of Light-Emitting Element 2>>

First, a glass substrate was prepared as the substrate 100.

An indium tin oxide film containing silicon oxide (ITSO) was formed over the glass substrate to a thickness of 110 nm by a sputtering method, thereby forming the cathode 101. A surface of the ITSO film was covered with a polyimide film so that an area of 2 mm×2 mm of the surface was exposed. The electrode area was 2 mm×2 mm. As pretreatment for forming the light-emitting element over the substrate; the surface of the substrate was washed with water and baked at 200° C. for 1 hour, and then UV ozone treatment was performed for 370 seconds.

Next, the substrate was fixed to a holder provided in the vacuum evaporation apparatus so that the surface of the substrate over which the ITSO film was formed faced downward. After that, the pressure inside the vacuum evaporation apparatus was reduced to approximately 10$^{-4}$ Pa, vacuum baking at 170° C. for 30 minutes was performed in a heating chamber of the vacuum evaporation apparatus, and then the substrate was cooled down for approximately 30 minutes.

After the substrate was cooled, PCPPn and molybdenum oxide were co-evaporated such that the weight ratio of PCPPn to molybdenum oxide was 1:0.5. The thickness was set to 15 nm. Then, BPhen was evaporated to a thickness of 5 nm. The film formed by co-evaporation of PCPPn and molybdenum oxide and the BPhen film collectively function as the layer 102 which prevents contact of an alkali metal or an alkaline earth metal with the cathode and serves as a buffer.

Furthermore, lithium oxide (Li$_2$O) was deposited by evaporation to a thickness of 0.1 nm, and then BPhen was deposited by evaporation to a thickness of 10 nm. Thus, the electron-injection layer 103 was formed.

When evaporation during the formation of the electron-injection layer 103 allows lithium oxide to reach the surface on which lithium oxide is formed, Li is diffused into the layer thereunder. However, the layer 102 suppresses entry of Li into the cathode 101. Contact of Li with the cathode increases driving voltage, reduces power efficiency, and shortens a lifetime in the case of an inverted-structure light-emitting element without the layer 102.

Furthermore, 2mDBTBPDBq-II was evaporated to a thickness of 10 nm, thereby forming the electron-transport layer 104.

Over the electron-transport layer 104, 2mDBTBPDBq-II, PCBNBB, and [Ir(tppr)$_2$(dpm)] were co-evaporated to a thickness of 30 nm such that the weight ratio was 0.8:0.2:0.06 (=2mDBTBPDBq-II:PCBNBB:[Ir(tppr)$_2$(dpm)]), thereby forming the light-emitting layer 105.

Over the light-emitting layer 105, BPAFLP was deposited to a thickness of 20 nm, thereby forming the hole-transport layer 106.

Over the hole-transport layer 106, PCPPn and molybdenum oxide were co-evaporated to a thickness of 15 nm such that the weight ratio of PCPPn to molybdenum oxide was 1:0.5, thereby forming the hole-injection layer 107.

Next, aluminum was deposited to a thickness of 200 nm by evaporation over the hole-injection layer 107, thereby forming the anode 108.

The light-emitting element 2 was completed with the cathode 101, the layer 102, the electron-injection layer 103, the electron-transport layer 104, the light-emitting layer 105, the hole-transport layer 106, the hole-injection layer 107, and the anode 108. Note that in all the examples in this specification, evaporation was performed by a resistance-heating method.

<<Fabrication of Comparative Light-Emitting Element 2>>

A comparative light-emitting element 2 was formed in substantially the same manner as the light-emitting element 2 except for the layer 102 and the thickness of the light-emitting layer 105. The electron-injection layer 103 was formed over the cathode 101 without formation of the layer 102. The light-emitting layer 105 was formed to a thickness of 40 nm.

The structure except for the layer 102 and the thickness of the light-emitting layer 105 is the same as that of the light-emitting element 2, and repetition of the description thereof is omitted. Refer to the method of fabricating the light-emitting element 2.

As described above, the comparative light-emitting element 2 was completed. The difference between the comparative light-emitting element 2 and the light-emitting element 2 is whether the layer 102 that suppresses movement of an alkali metal or an alkaline earth metal is formed or not and the thickness of the light-emitting layer 105. The following Table 3 summarizes stacked-layer structures of the comparative light-emitting element 2 and the light-emitting element 2.

The comparative light-emitting element 2 has higher driving voltage and lower power efficiency than the light-emitting element 2. This is because the comparative light-emitting element 2 does not include layer 102 and the electron-injection layer 103 containing an alkali metal or an alkaline earth metal is in direct contact with the cathode 101, which causes a large electron injection barrier between the cathode and the electron-injection layer.

<<Reliability Tests of Light-Emitting Element 2 and Comparative Light-Emitting Element 2>>

Figure 12:
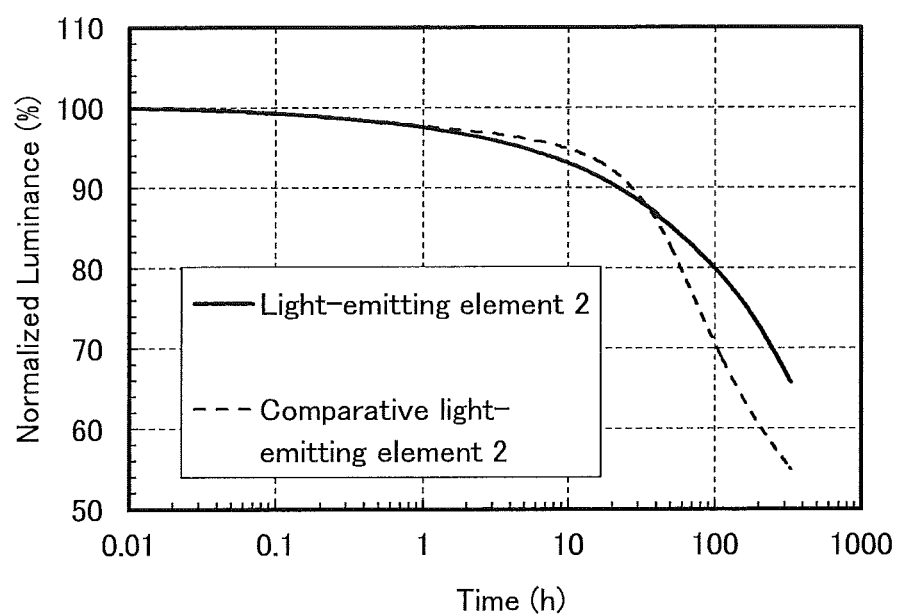
FIG. 12 shows time dependences of normalized luminance of the light-emitting element 2 and the comparative light-emitting element 2.

Furthermore, the light-emitting element 2 and the comparative light-emitting element 2 were subjected to reliability tests. FIG. 12 shows time dependence of normalized luminance at the time of constant current drive. In FIG. 12, the vertical axis represents normalized luminance (%), and the horizontal axis represents time (h).

TABLE 3

| | Cathode 101 | Layer 102 | | Electron-injection layer 103 | |
|---|---|---|---|---|---|
| Light-emitting element 2 | ITSO (110 nm) | PCPPn:MoOx (1:0.5, 15 nm) | BPhen (5 nm) | Li$_2$O (0.1 nm) | BPhen (10 nm) |
| Comparative light-emitting element 2 | | | | | |

| | Electron-transport layer 104 | Light-emitting layer 105 | Hole-transport layer 106 | Hole-injection layer 107 | Anode 108 |
|---|---|---|---|---|---|
| | 2mDBTBPDBq-II (10 nm) | *2 *3 | BPAFLP (20 nm) | PCPPn:MoOx (1:0.5 15 nm) | Al (200 nm) |

*2 2mDBTBPDBq-II:PCBNBB:[Ir(tppr)$_2$(dpm)] (0.8:0.2:0.06 30 nm)
*3 2mDBTBPDBq-II:PCBNBB:[Ir(tppr)$_2$(dpm)] (0.8:0.2:0.06 40 nm)

<<Operation Characteristics of Light-Emitting Element 2 and Comparative Light-Emitting Element 2>>

In a glove box under a nitrogen atmosphere, the light-emitting element 2 and the comparative light-emitting element 2 obtained as described above were sealed so as not to be exposed to the air (a sealant was applied onto the periphery of each element, and heat treatment at 80° C. for 1 hour and UV treatment were performed). Then, the operation characteristics of the light-emitting element 2 and the comparative light-emitting element 2 were measured. Note that the measurements were carried out at room temperature (in an atmosphere kept at 25° C.).

Figure 10:
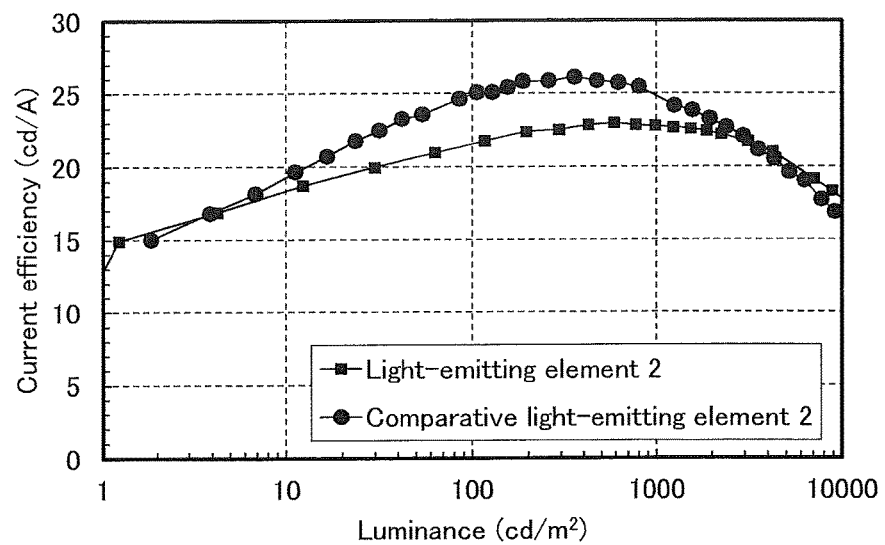
FIG. 10 shows luminance versus current efficiency characteristics of a light-emitting element 2 and a comparative light-emitting element 2.
Figure 11:
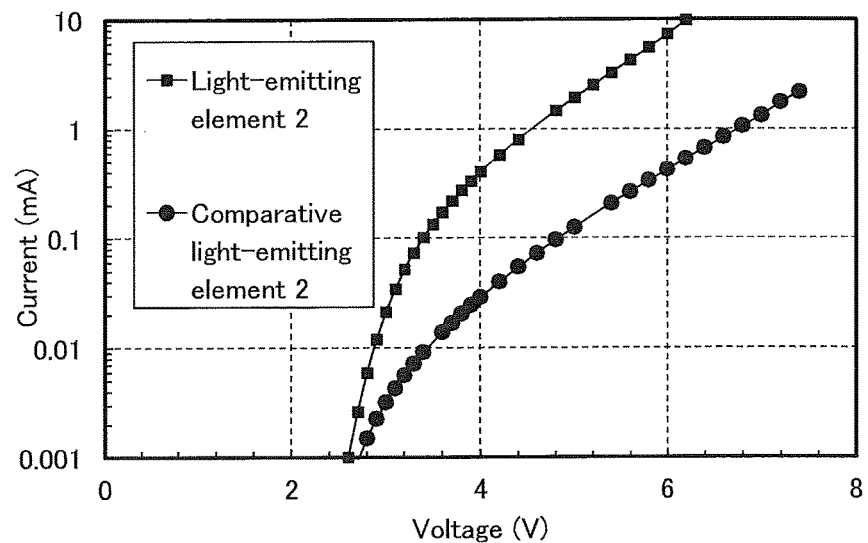
FIG. 11 shows voltage versus current characteristics of the light-emitting element 2 and the comparative light-emitting element 2.

FIG. 10 shows luminance versus current efficiency characteristics of the light-emitting element 2 and the comparative light-emitting element 2, and FIG. 11 shows voltage versus current characteristics thereof. In FIG. 10, the vertical axis represents current efficiency (cd/A), and the horizontal axis represents luminance (cd/m$^2$). In FIG. 11, the vertical axis represents current (mA), and the horizontal axis represents voltage (V).

Table 4 lists the values of the main characteristics. Note that the light-emitting element 2 and the comparative light-emitting element 2 emitted red light.

In the reliability tests, the luminance of the light emitting element 2 after 330 hours from the start of testing kept approximately 66% of the initial luminance, whereas that of the comparative light emitting element 2 decreases to approximately 55% of the initial luminance after 330 hours from the start of testing.

A luminance reduction with driving time is smaller, a voltage change at the time of constant current drive is much smaller, and reliability is higher in the light-emitting element 2 than those in the comparative light-emitting element 2. The inverted-structure light-emitting element which includes the layer 102 can be a highly reliable light-emitting element enjoying the advantage of the inverted structure because of the function of the layer 102.

This application is based on Japanese Patent Application serial no. 2014-093657 filed with Japan Patent Office on Apr. 30, 2014, the entire contents of which are hereby incorporated by reference.

What is claimed is:
1. A light-emitting element comprising:
a cathode including an oxide conductive film over a substrate;

TABLE 4

| | Voltage (V) | Current (mA) | Current density (mA/cm$^2$) | Chromaticity (x, y) | Luminance (cd/m$^2$) | Current efficiency (cd/A) | Power efficiency (lm/W) |
|---|---|---|---|---|---|---|---|
| Light-emitting element 2 | 3.6 | 0.17 | 4.32 | (0.66, 0.34) | 986 | 22.8 | 19.9 |
| Comparative light-emitting element 2 | 5.2 | 0.16 | 4.05 | (0.66, 0.34) | 990 | 24.4 | 14.7 | a first layer over the cathode;
a second layer over and in contact with the first layer;
a light-emitting layer over the second layer; and
an anode over the light-emitting layer,
wherein the first layer is a single layer,
wherein the first layer is in contact with the cathode,
wherein the second layer includes an alkali metal or an alkaline earth metal,
wherein the first layer includes an electron-transport material and,
wherein the cathode has a higher work function than the anode.

2. A light-emitting element comprising:
a cathode including an oxide conductive film over a substrate;
a third layer over the cathode;
a first layer over the third layer;
a second layer over and in contact with the first layer;
a light-emitting layer over the second layer; and
an anode over the light-emitting layer,
wherein the first layer is a single layer,
wherein the third layer is in contact with the cathode,
wherein the third layer contains a hole-transport material and an electron acceptor,
wherein the second layer includes an alkali metal or an alkaline earth metal, and
wherein the first layer includes an electron-transport material.

3. The light-emitting element according to claim 1, wherein the first layer is capable of suppressing diffusion of the alkali metal or the alkaline earth metal into the cathode.

4. The light-emitting element according to claim 1, wherein the electron-transport material includes bathophenanthroline or tris(8-quinolinolato)aluminum.

5. The light-emitting element according to claim 2, wherein the electron-transport material includes bathophenanthroline or tris(8-quinolinolato)aluminum.

6. The light-emitting element according to claim 1, wherein the alkali metal or the alkaline earth metal is lithium or calcium.

7. The light-emitting element according to claim 1, wherein the anode includes oxygen, tin, and indium.

8. The light-emitting element according to claim 1, wherein the cathode includes a material having a light-transmitting property.

9. The light-emitting element according to claim 1, wherein the cathode includes indium, tin, and oxygen.

10. A light-emitting device comprising:
the light-emitting element according to claim 1; and
a field-effect transistor,
wherein the cathode is electrically connected to the field-effect transistor.

11. A light-emitting device comprising:
the light-emitting element according to claim 2; and
a field-effect transistor,
wherein the cathode is electrically connected to the field-effect transistor.

12. The light-emitting device according to claim 10, wherein the field-effect transistor is an n-channel field-effect transistor.

13. The light-emitting device according to claim 10, wherein the field-effect transistor includes an oxide semiconductor in a semiconductor layer.

14. The light-emitting device according to claim 13, wherein the oxide semiconductor includes indium, tin, and gallium.

15. An electronic appliance comprising a color filter and the light-emitting device according to claim 10.

16. An electronic appliance comprising a touch panel and the light-emitting device according to claim 10.

17. A lighting device comprising a housing and the light-emitting device according to claim 10.

18. The light-emitting element according to claim 1, wherein the first layer is in contact with the cathode.

19. The light-emitting element according to claim 2, wherein the alkali metal or the alkaline earth metal is lithium or calcium.

20. The light-emitting element according to claim 2, wherein the anode includes oxygen, tin, and indium.

21. The light-emitting element according to claim 2, wherein the cathode includes a material having a light-transmitting property.

22. The light-emitting element according to claim 2, wherein the cathode includes indium, tin, and oxygen.

23. The light-emitting device according to claim 11, wherein the field-effect transistor is an n-channel field-effect transistor.

24. The light-emitting device according to claim 11, wherein the field-effect transistor includes an oxide semiconductor in a semiconductor layer.

25. The light-emitting device according to claim 24, wherein the oxide semiconductor includes indium, tin, and gallium.

26. An electronic appliance comprising a color filter and the light-emitting device according to claim 11.

27. An electronic appliance comprising a touch panel and the light-emitting device according to claim 11.

28. A lighting device comprising a housing and the light-emitting device according to claim 11.

29. The light-emitting element according to claim 1, wherein the light-emitting element is configured to emit light by combination of an electron and a hole in the light-emitting layer, the electron being injected to the light-emitting layer from the cathode through the first layer and the second layer sequentially and the hole being injected to the light-emitting layer from the anode.

30. The light-emitting element according to claim 2, wherein the light-emitting element is configured to emit light by combination of an electron and a hole in the light-emitting layer, the electron being injected to the light-emitting layer from the cathode through the first layer and the second layer sequentially and the hole being injected to the light-emitting layer from the anode.

31. The light-emitting element according to claim 2, wherein the cathode has a higher work function than the anode.

32. The light-emitting element according to claim 1, wherein the first layer is essentially consisting of an electron-transport material.

33. The light-emitting element according to claim 2, wherein the first layer is essentially consisting of an electron-transport material.

* * * * *